United States Patent
Ueda et al.

(10) Patent No.: US 6,425,722 B1
(45) Date of Patent: Jul. 30, 2002

(54) SUBSTRATE TREATMENT SYSTEM, SUBSTRATE TRANSFER SYSTEM, AND SUBSTRATE TRANSFER METHOD

(75) Inventors: Issei Ueda; Masami Akimoto, both of Kumamoto; Kazuhiko Ito, Kumamoto-ken; Mitiaki Matsushita, Yatsushiro; Masatoshi Kaneda, Kumamoto-ken; Yuji Matsuyama, Kumamoto-ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/521,423

(22) Filed: Mar. 8, 2000

Related U.S. Application Data

(62) Division of application No. 08/908,056, filed on Aug. 11, 1997, now Pat. No. 6,074,154.

(30) Foreign Application Priority Data

Aug. 29, 1996 (JP) ............................................. 8-228583
Feb. 28, 1997 (JP) ............................................. 9-062210

(51) Int. Cl.$^7$ ............................................. B65G 49/07
(52) U.S. Cl. .................... 414/217; 414/217.1; 414/936; 414/939; 414/940
(58) Field of Search ................................. 414/217, 937, 414/939, 936, 217.1, 221, 940

(56) References Cited

U.S. PATENT DOCUMENTS

| | | | | |
|---|---|---|---|---|
| 5,277,579 A | * | 1/1994 | Takanabe | 414/937 X |
| 5,431,600 A | * | 7/1995 | Murata et al. | 414/411 X |
| 5,433,785 A | * | 7/1995 | Saito | 414/937 X |
| 5,442,416 A | | 8/1995 | Tateyama et al. | |
| 5,462,397 A | * | 10/1995 | Iwabuchi | 414/217 X |
| 5,562,383 A | * | 10/1996 | Iwai et al. | 414/411 X |
| 5,565,034 A | * | 10/1996 | Nanbu et al. | 414/936 X |
| 5,571,330 A | * | 11/1996 | Kyogoku | 414/217 X |
| 5,609,459 A | * | 3/1997 | Muka | 414/939 X |
| 5,772,386 A | * | 6/1998 | Mages et al. | 414/411 |
| 5,788,448 A | * | 8/1998 | Wakamori et al. | 414/939 X |
| 5,810,537 A | * | 9/1998 | Briner et al. | 414/217 |
| 5,895,191 A | * | 4/1999 | Bonora et al. | 414/940 X |
| 6,082,949 A | * | 7/2000 | Rosenquist | 414/217 |

FOREIGN PATENT DOCUMENTS

DE 195 42 646 10/1996

OTHER PUBLICATIONS

Patent Abstracts of Japan, vol. 96, No. 7, Jul. 31, 1996, JP 08–070032, Mar. 12, 1996.
Patent Abstracts of Japan, vol. 95, No. 5, May 31, 1996, JP 08–017894, Jan. 19, 1996.

* cited by examiner

*Primary Examiner*—Steven A. Bratlie
(74) *Attorney, Agent, or Firm*—Oblon, Spivak, McClelland, Maier & Neustadt, PC

(57) ABSTRACT

A substrate transfer system comprising a cassette table for mounting a cassette which has an opening portion for loading and unloading a substrate and a cover detachably provided to the opening portion, process portion for processing the substrate housed in a cassette on the cassette table, a transfer arm mechanism for taking out the substrate from the cassette table, transferring it to process units G1 to G5, and returning a processed substrate to the cassette on the cassette table, partition members provided between the transfer arm mechanism and the cassette table, for separating an atmosphere on the side of the transfer arm mechanism from that on the side of the cassette table, a passage formed in the partition member so as to face the opening portion of the cassette on the cassette table, for passing the substrate taken out from the cassette on the cassette table by the transfer arm mechanism and returning the substrate to the cassette on the cassette table, cassette moving mechanisms for moving the opening portion of the cassette on the cassette table closer to the passage or to be farther from the passage, and a cover removing mechanism for detaching the cover from the opening portion or attaching the cover to the opening portion of the cassette.

6 Claims, 23 Drawing Sheets

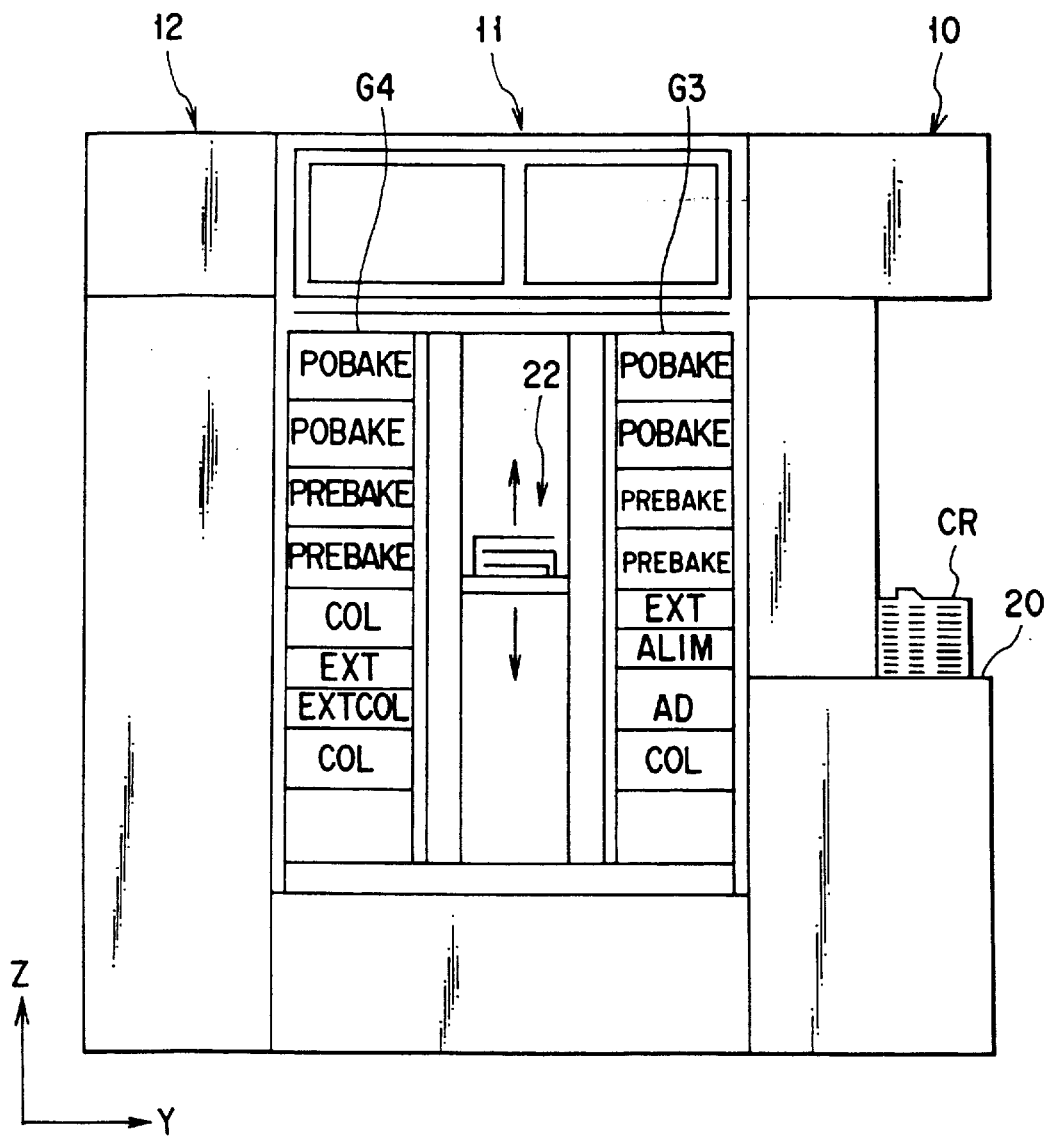
F I G. 4

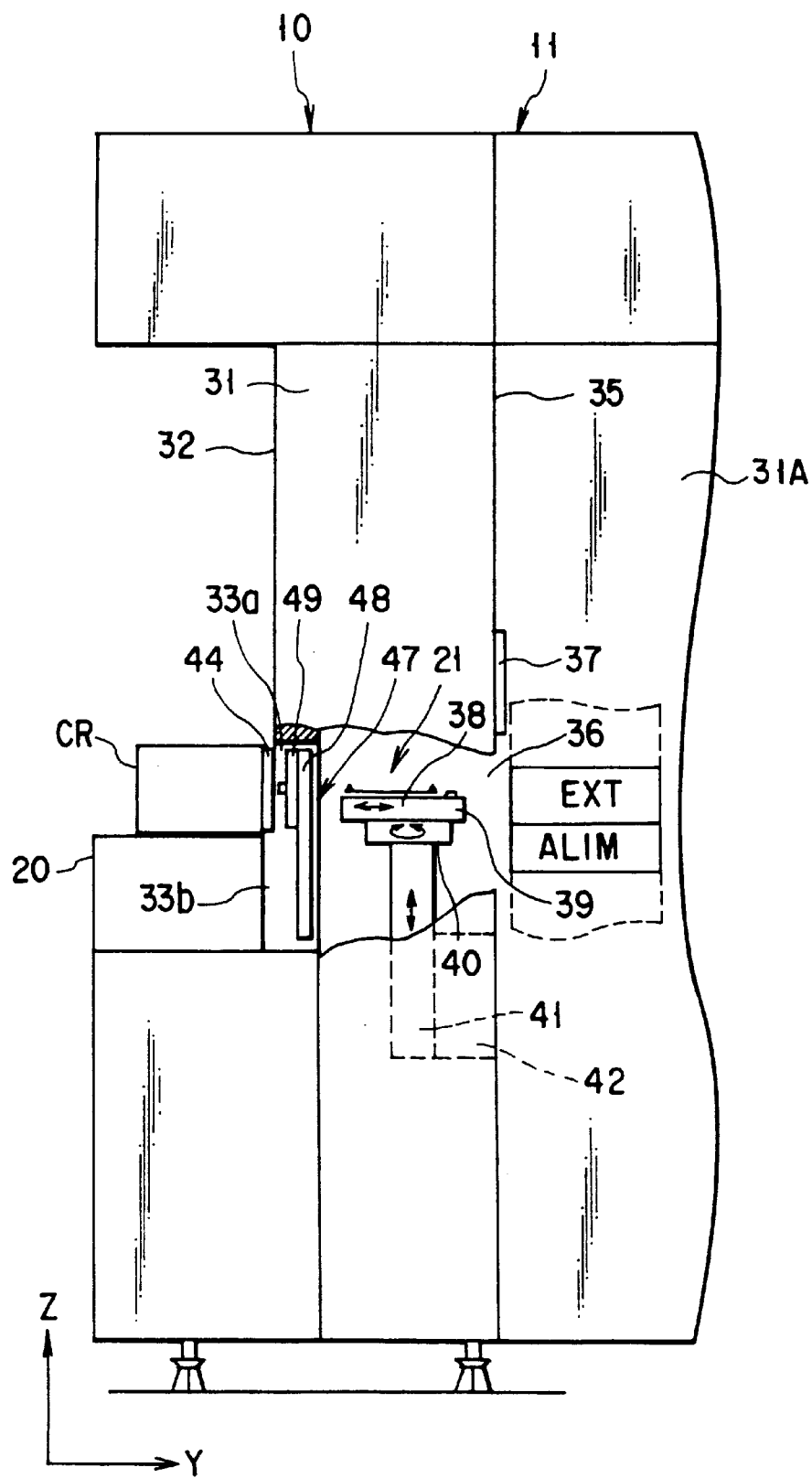
F I G. 5

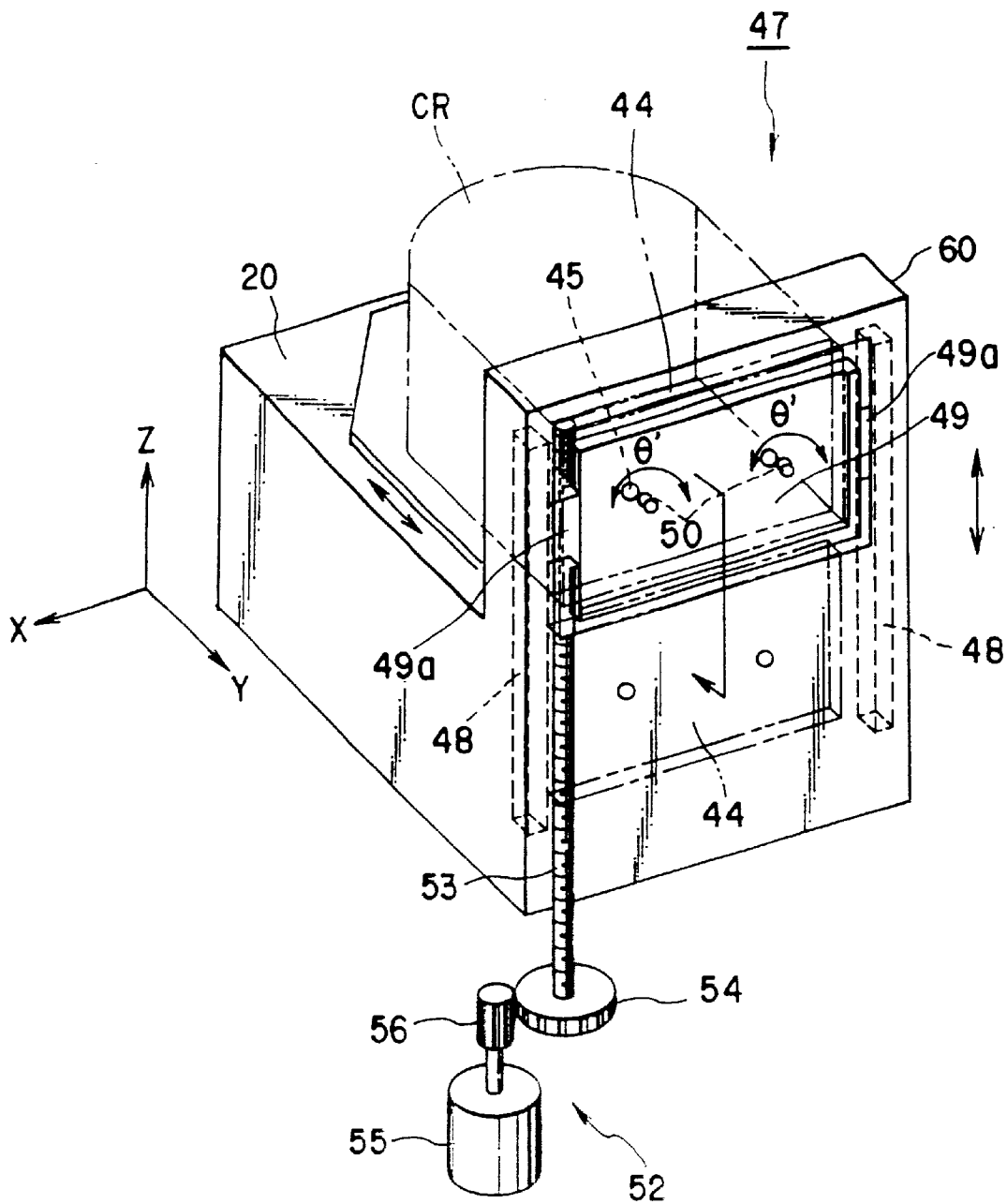
F I G. 6

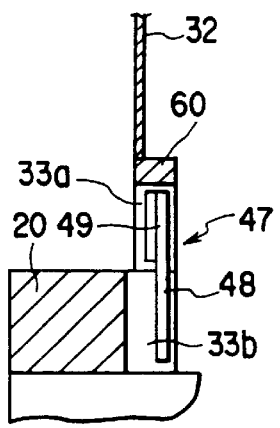
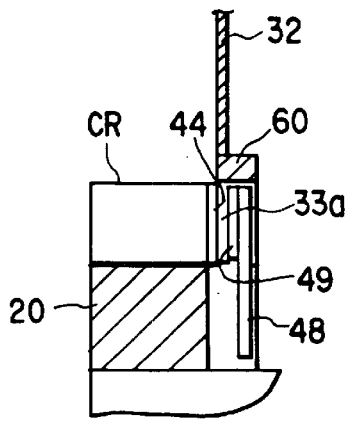
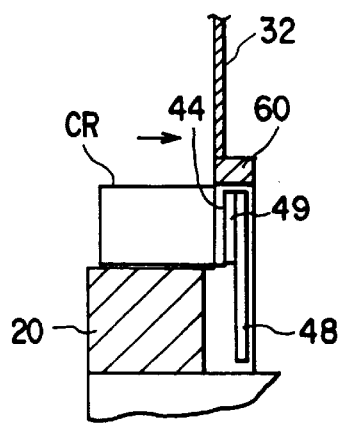
FIG. 8A         FIG. 8B         FIG. 8C
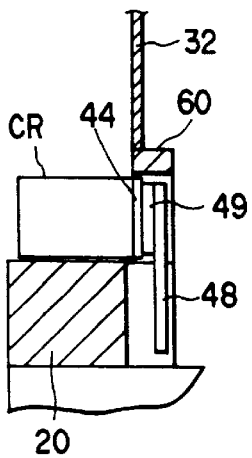
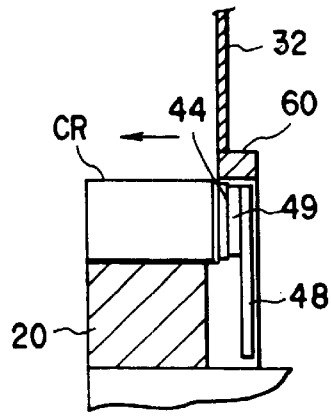
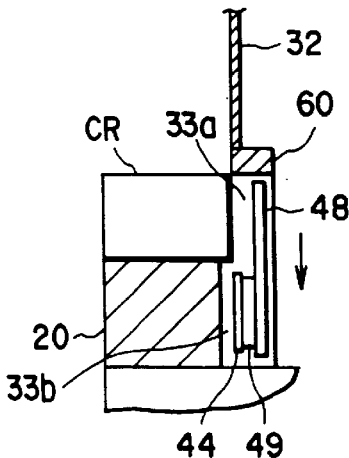
FIG. 8D         FIG. 8E         FIG. 8F

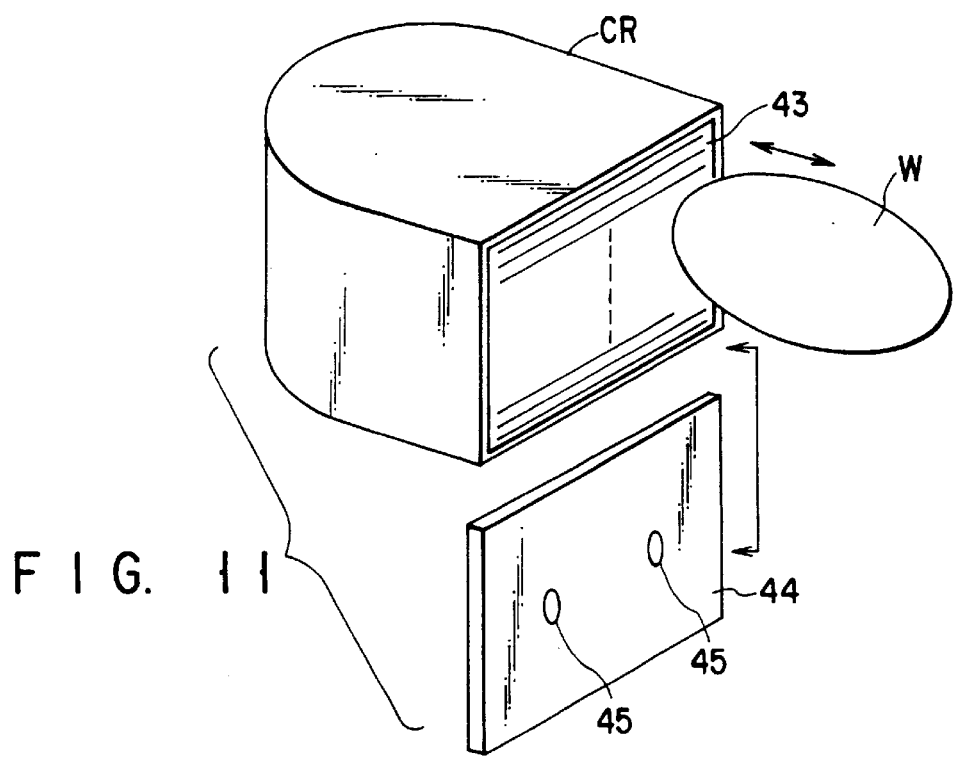
F I G. 11
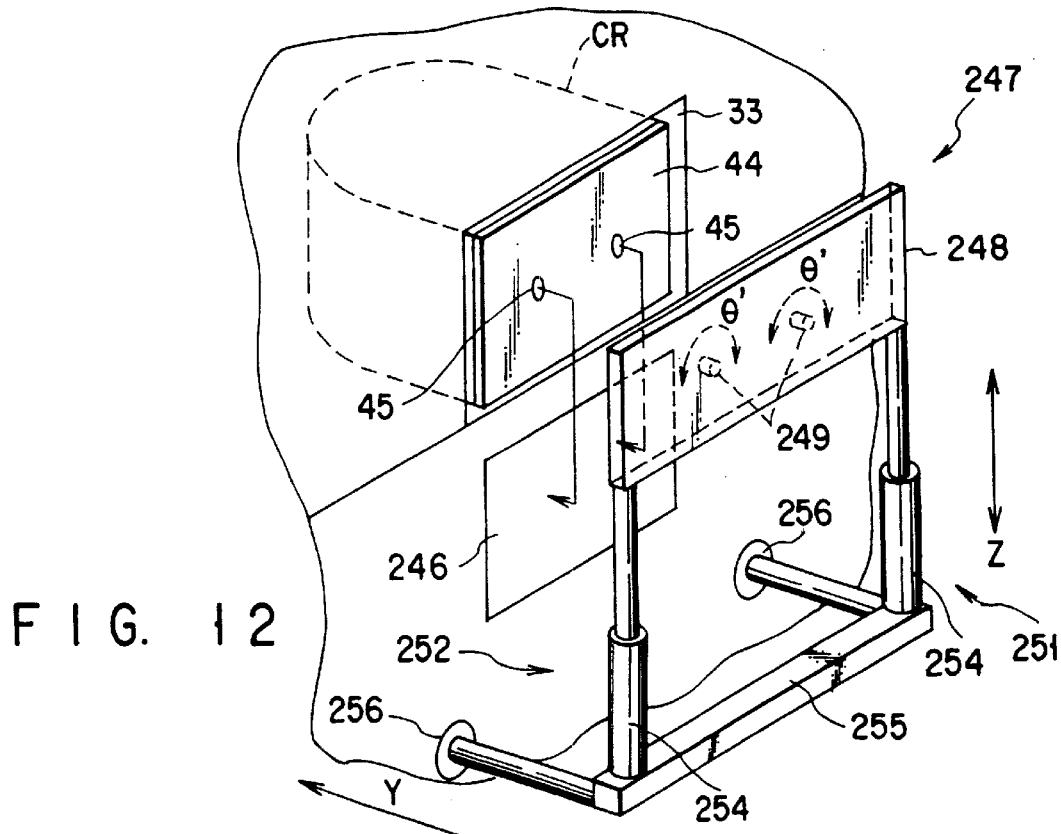
F I G. 12

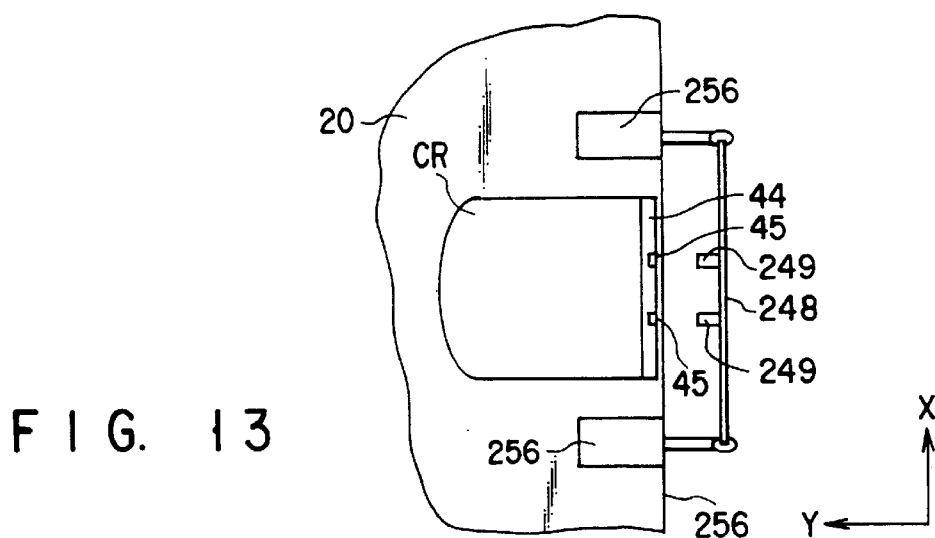
FIG. 13
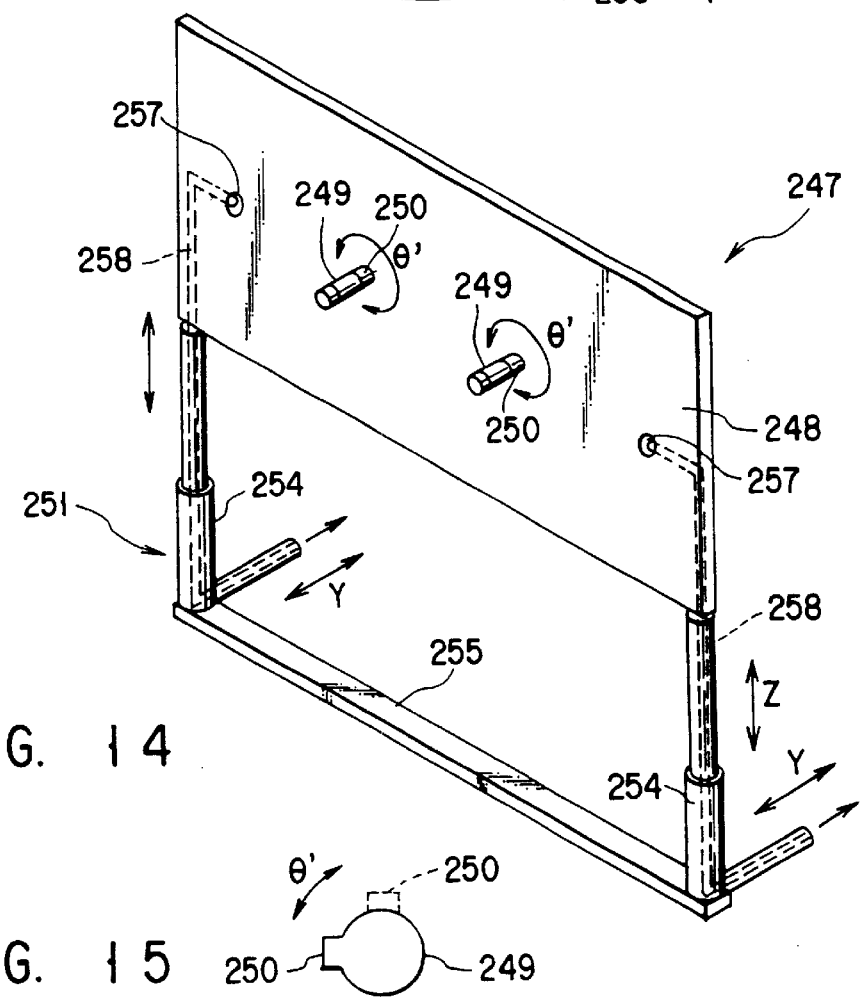
FIG. 14
FIG. 15

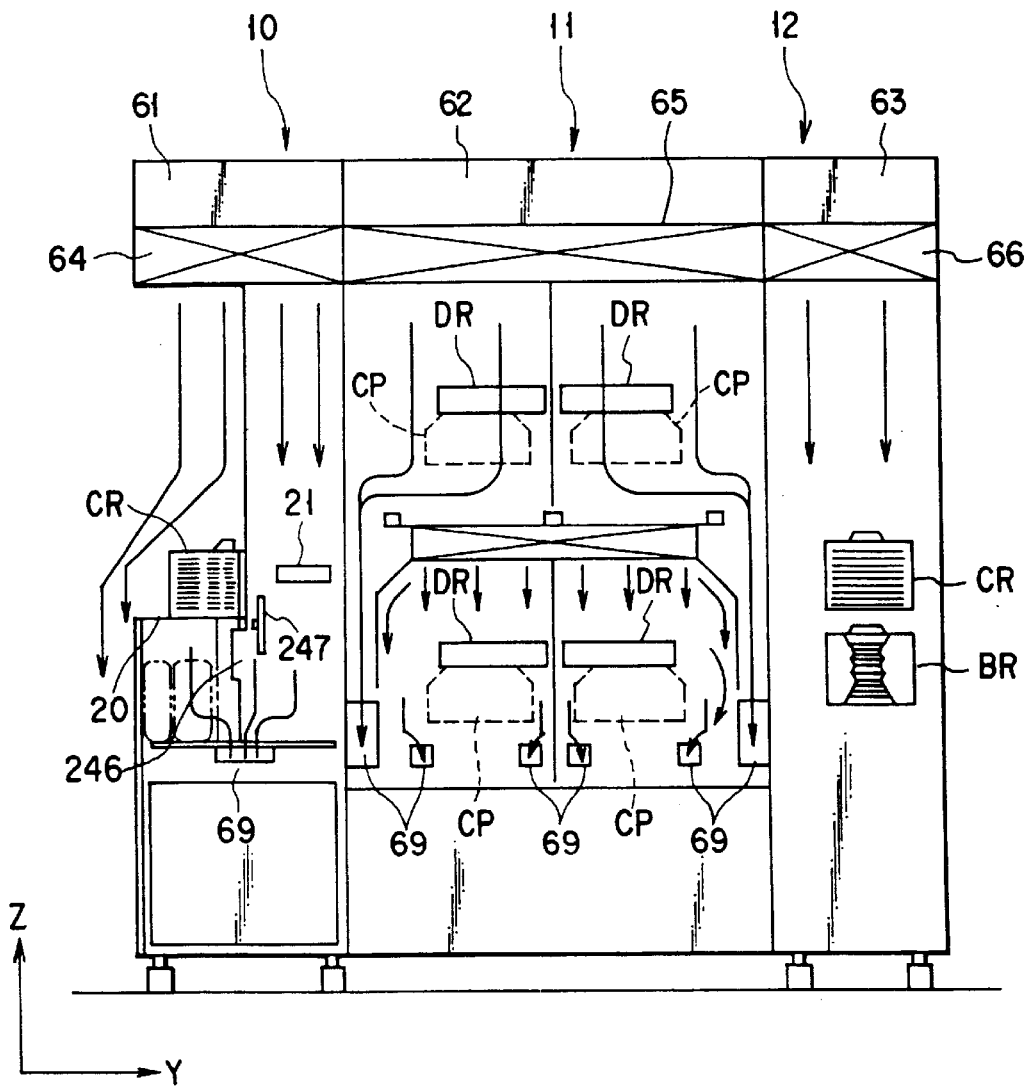
F I G. 16

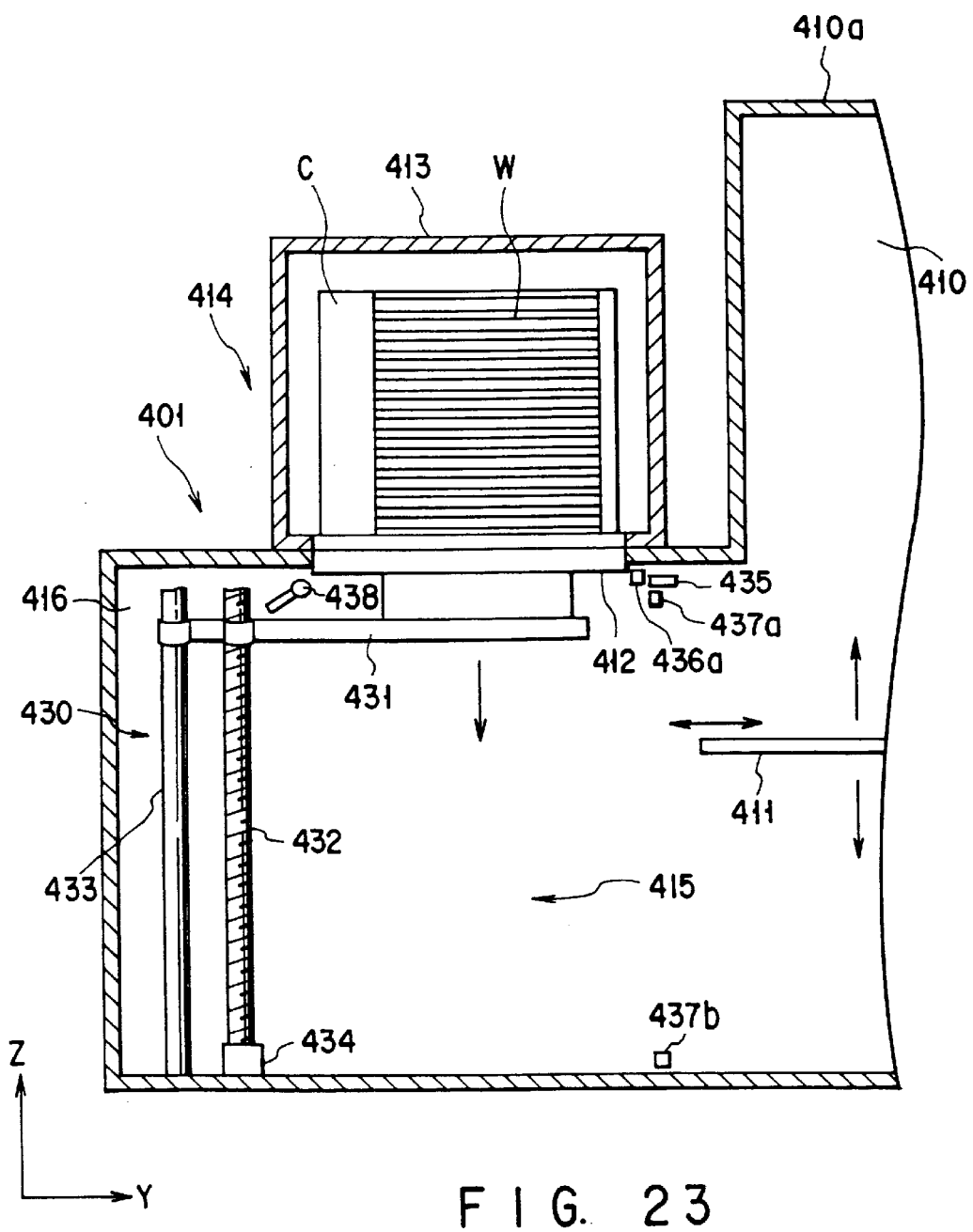
F I G. 23

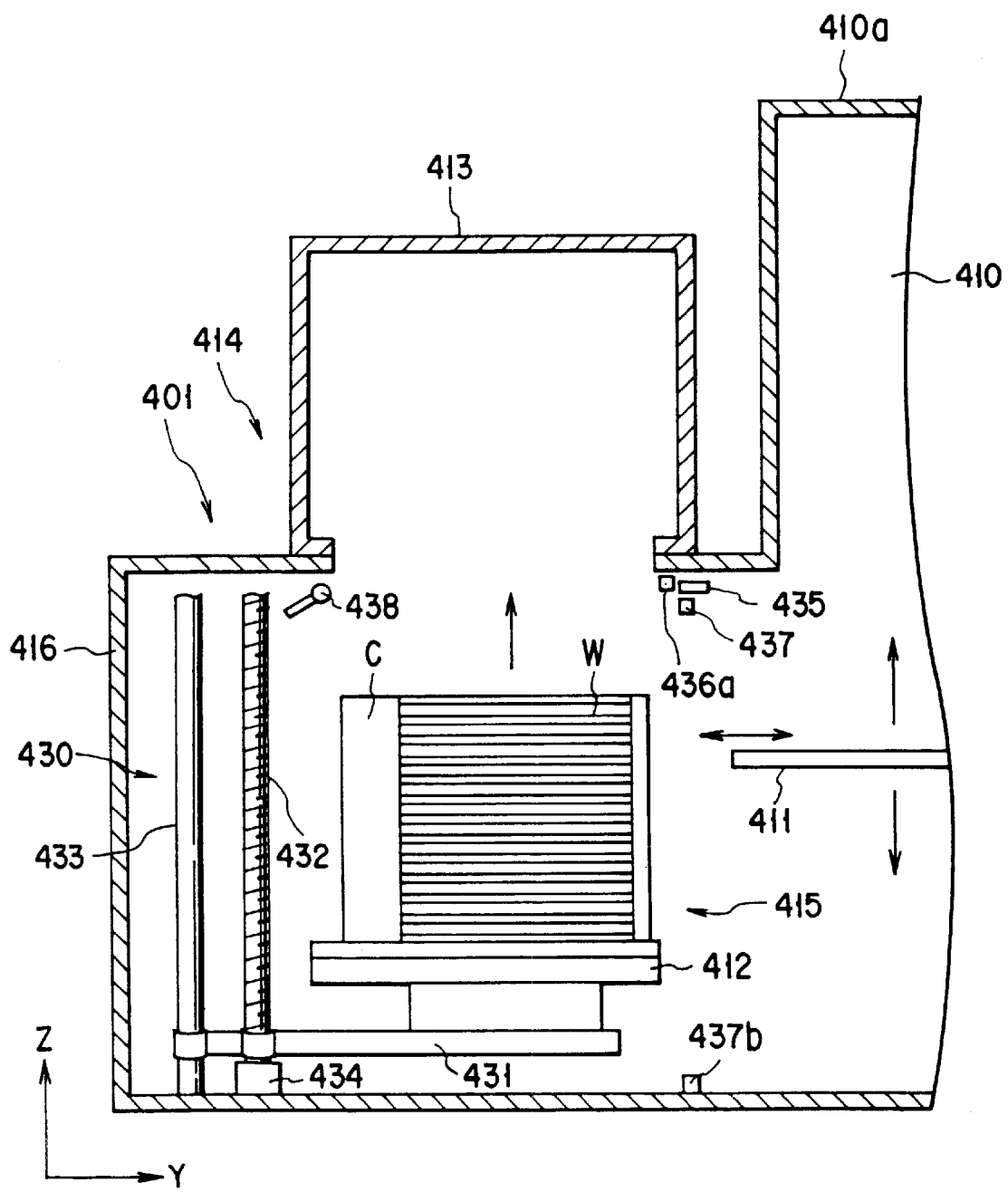
F I G. 24

SUBSTRATE TREATMENT SYSTEM, SUBSTRATE TRANSFER SYSTEM, AND SUBSTRATE TRANSFER METHOD

This application is a divisional of U.S. application Ser. No. 08/908,056, filed Aug. 11, 1997, now U.S. Pat. No. 6,074,154.

BACKGROUND OF THE INVENTION

1. Field of the Invention

The present invention relates to a substrate treatment system, a substrate transfer system, and substrate transfer method for use in transferring a substrate such as a semiconductor wafer and an LCD substrate from a cassette station to a process station.

2. Discussion of the Background

Recently, sizes of semiconductor wafers have been increased. With the size increase, the wafers tend to be processed one by one in semiconductor device manufacturing processes. For example, in a complex process system (resist coating and developing are performed in one process), substrates are taken out from a cassette one by one, processed in a process unit, and returned to the cassette one by one.

In a conventionally-used coating and developing process system as shown in FIG. 1, a plurality of cassettes CR are placed on a cassette station 102. Wafers W are taken out from the cassette CR one by one by means of a wafer transfer mechanism 105, loaded into a process station 101, and subjected to a resist coating and developing process. The wafer transfer mechanism 105 comprises a movement unit 103 and an arm 104. The arm 104 is moved separately by means of the movement unit 103 in the X, Y, and Z axis directions and rotated about the Z axis by a θ angle. The processed wafer W is returned to the cassette CR on the cassette station 102 by the wafer transfer mechanism 105.

To prevent particles from attaching onto the wafer W, the resist coating and developing process system is positioned in a clean room where clean air constantly flows downwardly.

Furthermore, to prevent particles from entering the cassette CR during the conveyance of the cassette, a detachable cover is provided to the opening of the cassette CR. However, when the cassette CR is placed in the cassette station 102 with the cover removed, the cover intervenes in the down-flow of clean air in the process system, creating an air flow which will allow invasion of particles into a process station 101.

In the wafer processing step, a washing device (scrubber) is used for washing the front and rear surfaces of the wafer with a brush. The washing device comprises a cassette station 401 and a process station 402. The process station 402 comprises a center transfer passage 420, a front-surface washing unit 421, a rear-surface washing unit 423, wafer reverse units 427, 428, heating and cooling units 425, 426, and a wafer transfer mechanism 403.

To prevent particles from attaching to the wafer as much as possible in such a washing device, the wafer cassette CR is placed in an airtight chamber (So-called SMIF POD) 413 and the SMIF POD containing the cassette CR is transferred to the cassette station 401. In the cassette station 401, the SMIF POD 413 is descended to the wafer transfer portion while the SMIF POD 413 is kept airtight. In the SMIF system, wafers are transferred one by one from the cassette CR of the wafer transfer portion to the process station 402, washed, and returned to the cassette CR. Thereafter, the wafer cassette CR is ascended and returned to the SMIF POD 413 on the cassette station 401.

However, the conventionally-used device has a problem. If a wafer W protrudes from the cassette CR, the protruding wafer sometimes hits against the upper wall of the wafer transfer portion and causes damages when the wafer cassette CR is returned to the SMIF POD 413. Furthermore, when the wafer protrudes from the cassette CR, the protruding wafer interferes with a mapping sensor 21b, inducing misoperation of mapping, as shown in FIG. 9.

BRIEF SUMMARY OF THE INVENTION

An object of the present invention is to provide a substrate treatment system, a substrate transfer system, and a substrate transfer method capable of loading and unloading a substrate to a cassette with a cover without disturbing a down-flow of clean air in the cassette station, capable of preventing particles from attaching to the substrate, efficiently, and capable of preventing particles from flowing into the process station side from the cassette station side.

Another object of the present invention is to provide a substrate treatment system, a substrate transfer system, and a substrate transfer method producing no substrate breakage when a cassette is returned to a cassette mounting portion from a substrate transfer portion.

(1) A substrate treatment system according to the present invention comprises a cassette table for mounting a cassette which has an opening portion for loading and unloading a substrate and a cover detachably provided to the opening portion, a process portion for processing the substrate stored in the cassette on the cassette table, a transfer arm mechanism for taking out the substrate from the cassette on the cassette table, transferring the substrate to the process portion and returning a processed substrate to the cassette on the cassette table, a partition member provided between the transfer arm mechanism and the cassette table, for separating an atmosphere on the transfer arm mechanism side from that on the cassette table side, a passage for passing the substrate taken out from the cassette on the cassette table by the transfer arm mechanism and for passing the substrate to be returned to the cassette on the cassette table, the passage being formed in the partition member so as to face the opening of the cassette on the cassette table, a cassette moving mechanism for moving the cassette placed on the cassette table so as to be closer to the passage or to be farther from the passage, and a cover removing mechanism for attaching or detaching of the cover to the opening portion of the cassette.

According to the present invention, a down flow of clean air will not be disturbed by open/shut movement of the cassette cover, in the transfer room.

(2) A system according to the present invention comprises a cassette having an opening portion for loading/unloading a plurality of substrates and having a cover detachably provided to the opening portion, substrate transfer means for loading/unloading a substrate from the cassette through the opening portion, a partition member for separating a space on a cassette-side from a space on a substrate-transfer-means side, the partition member having a transfer window for transferring the substrate between the spaces, and a cover transfer mechanism for removing the cover from the cassette and transferring the cover to the lower space on the substrate-transfer-means side through the transfer window.

According to the present invention, the down flow of clean air will not be disturbed by the cover itself in the transfer room when the cover is attached to or detached from the cassette.

(3) A substrate treatment system according to the present invention comprises:

a cassette having an opening portion for loading/unloading a plurality of substrates and having a cover detachably provided to the opening portion, a cassette table on which a cassette is to be mounted, substrate transfer means for loading/unloading a substrate through the opening portion of the cassette mounted on the cassette table, a partition member for separating a space on a cassette side from a space on a substrate-transfer-means side, the partition member having a window for transferring a substrate between the spaces, a cover storage portion formed on a side of the cassette table, facing the space on the substrate-transfer-means side, for storing a cover removed from the cassette, and a cover transfer mechanism for removing the cover from the cassette through the transfer window, transferring the removed cover to the space on the substrate-transfer-means side, and storing the cover in the cover storage portion.

According to the present invention, the down flow of clean air will not be disturbed in the transfer room when the cassette is opened and shut. In addition, particles are prevented from attaching to a substrate in the transfer room and the process chamber 31A.

(4) A substrate transfer system according to the present invention comprises, a cassette having an opening portion for loading/unloading a plurality of substrates and having a cover detachably provided to the opening portion, substrate transfer means for loading/unloading a substrate from the cassette, the substrate transfer means being provided in a transfer room whose pressure is set higher than the inner pressure of the cassette, a partition member for separating a space on a cassette side from a space on a substrate-transfer-means side, the partition member having a window for transferring a substrate between the spaces, and a cover transfer mechanism for removing the cover from the cassette through the transfer window and transferring the removed cover to a lower space of the substrate transfer means.

According to the present invention, since the inner pressure of the transfer room for transferring the substrate is set higher than the outside pressure, particles can be prevented from entering the transfer room from the outside.

(5) A substrate treatment system according to the present invention is provided in a clean room. The substrate treatment system comprises:

a cassette having an opening portion for loading/unloading a plurality of substrates and having a cover detachably provided to the opening portion, substrate transfer means for loading/unloading a substrate from the cassette, the substrate transfer means being provided in a transfer room whose pressure is set higher than the inner pressure of the clean room, a partition member for separating a space on a cassette side from a space on a substrate-transfer-means side, the partition member having a window for transferring a substrate between the spaces, and a cover transfer mechanism for removing the cover from the cassette through the transfer window and transferring the removed cover to a lower space of the substrate-transfer-means side.

According to the present invention, since the pressure of the transfer room is set higher than an inner pressure of the clean room, particles can be prevented from entering the transfer room from the clean room.

(6) A substrate treatment system according to the present invention comprises:

a cassette having an opening portion for loading/unloading a plurality of substrates and having a cover detachably provided to the opening portion, a transfer room separated by a partition member having a first transfer window, for transferring a substrate from the cassette, substrate transfer means provided in the transfer room, for transferring a substrate from the cassette, and vice versa, through the first transfer window, a cover removing mechanism provided in the transfer room for removing a cover from the cassette through the first transfer window and transferring the cover to a lower space on a substrate-transfer-means side, a cover transfer mechanism for removing the cover from the cassette through the transfer window and transferring the removed cover to the lower space of a substrate-transfer-means side, and a process chamber 31A for processing the substrate transferred from a second transfer window. The process chamber 31A being provided adjacent to the transfer room, which has a second transfer window for transferring a substrate by the substrate transfer means between the process chamber 31A and the transfer room.

(7) A substrate treatment system according to the present invention comprises:

a cassette having an opening portion for loading/unloading a plurality of substrates and having a cover detachably provided to the opening portion, a transfer room set at a higher pressure than an inner pressure of the cassette and having a first transfer window for transferring a substrate from the cassette, substrate transfer means provided in the transfer room, for transferring a substrate from the cassette, and vice versa, through the first transfer window, a cover transfer mechanism provided in the transfer room, for removing a cover from the cassette through the first transfer window and transferring the cover to a lower portion of a space of the substrate transfer means side, a process chamber 31A for processing the substrate transferred through a second transfer window, the process chamber 31A being set at a higher pressure than an inner pressure of the transfer room, being disposed adjacent to the transfer room, and having the second transfer window for transferring a substrate by the substrate transfer means to the transfer room.

According to the present invention, since the pressure of the process chamber 31A is set higher than the inner pressure of the transfer room, particles can be prevented from entering the process chamber 31A from the transfer room.

(8) A substrate transfer system according to the present invention comprises a process portion for processing a substrate and a transfer portion for transferring the substrate to the process portion, and vice versa. In this substrate transfer system, the transfer portion comprises a mounting portion for mounting a cassette in which a plurality of substrates are horizontally placed, a substrate transfer portion provided below the mounting portion, for transferring the substrate to the process portion, moving means for moving the cassette between the mounting portion and the substrate transfer portion, detection means for detecting a protruding substrate when the cassette moves to the mounting portion from the transfer portion, and pushing means for pushing a protruding substrate detected by the detection means into the cassette.

(9) A substrate treatment system comprises a process portion for processing a substrate under airtight conditions and a transfer portion for transferring a substrate to the process portion under the airtight conditions. In this substrate treatment system, the transfer portion comprises a mounting portion for mounting an airtight container containing a cassette in which a plurality of substrates are horizontally placed, a substrate transfer portion provided in an airtight space communicated with the process portion below the mounting portion, moving means for moving the cassette between the table and the substrate transfer portion, detection means for detecting a protruding substrate when the cassette moves from the substrate transfer portion to the mounting portion, and pushing means for pushing the protruding substrate into the cassette when the protruding substrate is detected by the detection means.

(10) A substrate transfer system for transferring a substrate comprises:

a mounting portion for mounting a cassette in which a plurality of substrates are placed horizontally, a substrate transfer portion provided below the mounting portion, for transferring a substrate to other system, and vice versa, moving means for moving the cassette between the mounting portion and the substrate transfer portion, detection means for detecting a protruding substrate when the cassette is moved from the substrate transfer portion to the mounting portion, and pushing means for pushing a protruding substrate detected by the detection means.

(11) A method for transferring a substrate comprises the steps of:

(a) mounting a cassette in which a plurality of substrates are placed horizontally, on a mounting portion, (b) moving the cassette to a substrate transfer portion below the mounting portion, (c) transferring the substrate in the cassette to other system at a substrate transfer portion, (d) receiving the substrate from the other system into the cassette positioned at the substrate transfer portion, (e) moving the cassette containing the received substrate to the mounting portion, (f) detecting a protruding substrate when the cassette is moved to the mounting portion, and (g) pushing the protruding substrate detected into the cassette.

(12) A method for transferring substrate under airtight conditions, comprises the steps of:

(A) mounting an airtight container on a mounting portion, the airtight container containing a cassette in which a plurality of substrates are horizontally placed, (B) moving the cassette to a substrate transferring portion positioned in an airtight space below the mounting portion, (C) transferring the substrate in the cassette to other system at the substrate transfer portion, the other system being provided in an airtight space communicated with the airtight space, (D) receiving a substrate into the cassette positioned at the substrate transfer portion from the other system, (E) moving a cassette containing the received substrate to the mounting portion, (F) detecting a protruding substrate when the cassette is moved to the mounting portion, and (G) pushing the protruding substrate detected into the cassette.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a rear view of the substrate treatment system;

FIG. 5 is a perspective cross-sectional view of a cassette station, partially broken away, showing a cassette-cover removing mechanism of a first embodiment;

FIG. 6 is a perspective view of the casssette-cover removing mechanism of the first embodiment;

FIGS. 8A to 8M respectively show a series of procedures of removing a cassette-cover by the cassette cover removing mechanism of the first embodiment, sequentially;

FIG. 11 is an exploded perspective view of a cassette and a cover;

FIG. 12 is a perspective view of a cassette-cover removing mechanism and a cassette cover of a second embodiment;

FIG. 13 is a plan view of the cassette-cover removing mechanism of the second embodiment;

FIG. 14 is an exploded perspective view of the cassette-cover removing mechanism;

FIG. 15 is a cross-sectional view of a lock key of the cassette-cover removing mechanisms of first and second embodiments;

FIG. 16 is a perspective view showing a clean-air flow in the substrate treatment system;

FIG. 23 is a longitudinal perspective view of a cassette station when a cassette is positioned on the cassette table;

FIG. 24 is a longitudinal perspective view of a cassette station when a cassette is positioned on a wafer transfer portion;

DETAILED DESCRIPTION OF THE INVENTION

Hereinbelow, preferable embodiments of the present invention will be described with reference to the accompanying drawings.

Figure 1:
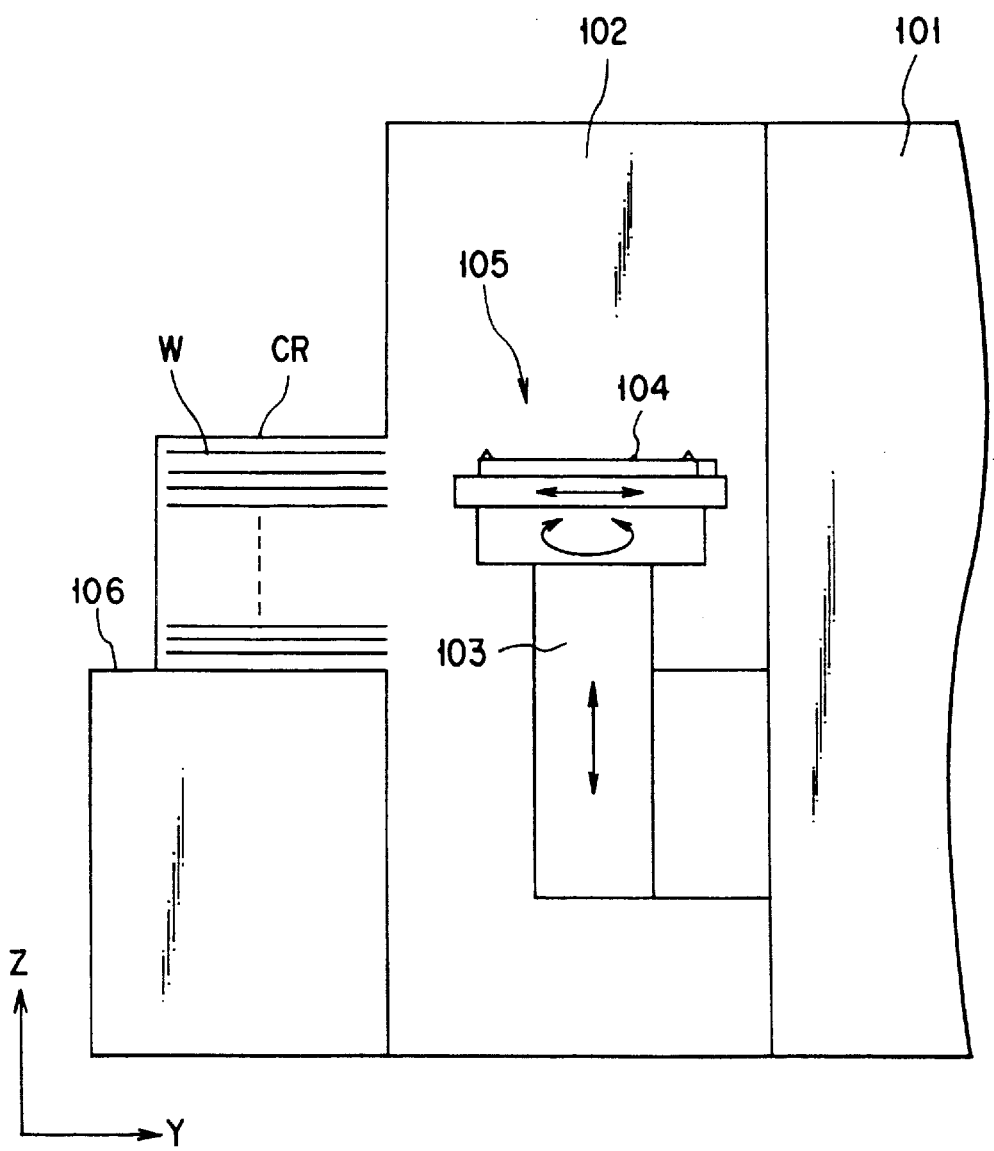
FIG. 1 is a schematic perspective view of a cassette portion of a conventionally-used coating and developing process system.
Figure 2:
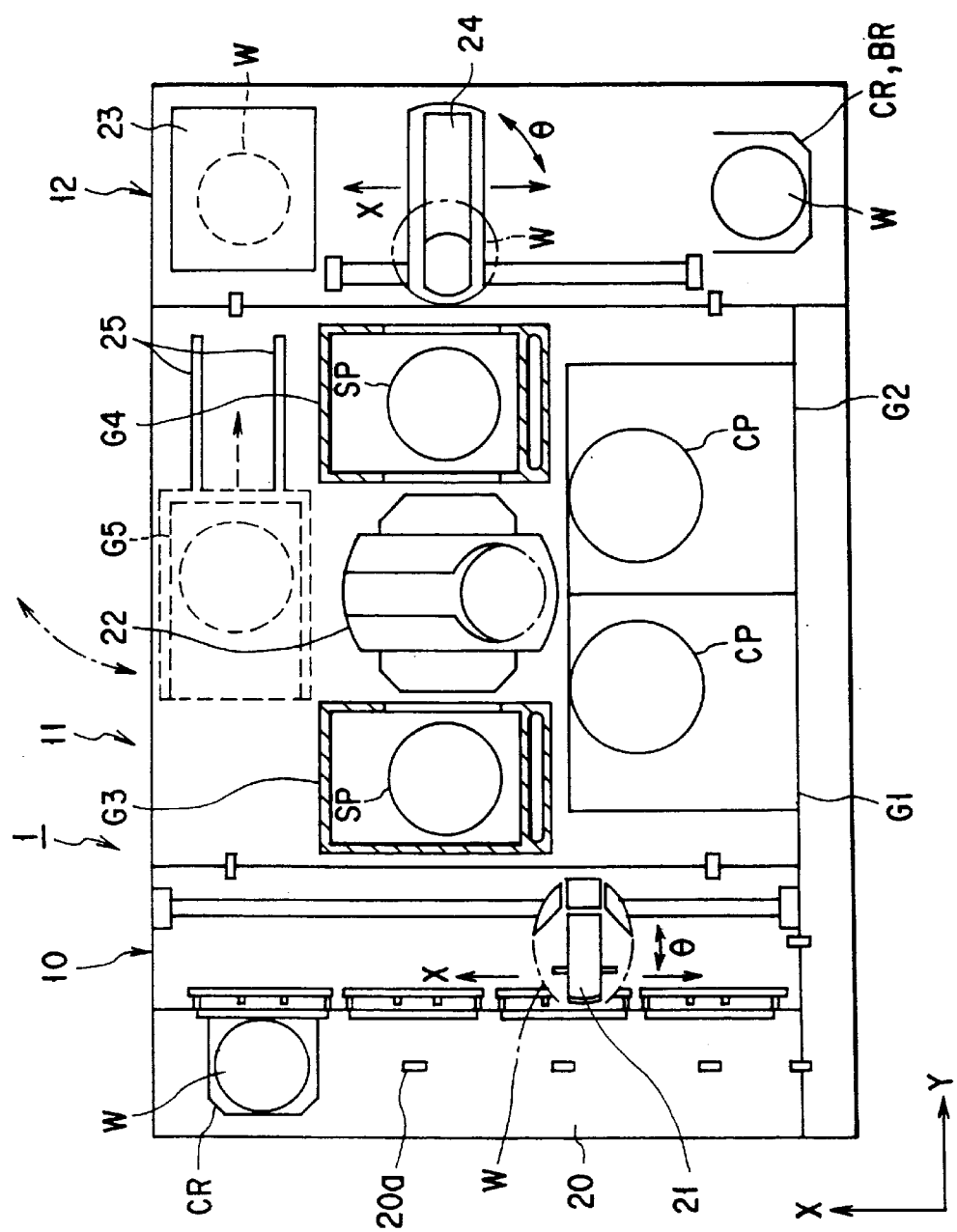
FIG. 2 is a plan view of the entire substrate treatment system according to the present invention.

As shown in FIG. 2, the coating and developing process system 1 (provided in a clean room) comprises a cassette station 10, a process station 11, an interface portion 12, first and second sub-arm mechanisms 21 and 24, and a main arm mechanism 22. Above the portions 10, 11 and 12, air-conditioning fan filter units (FFU) are provided. The fan filter unit (FFU) is responsible for blowing out clean air downwardly, thereby forming a clean-air down flow.

The cassette station 10 has a cassette table 20 designed for placing a plurality of cassettes CR thereon. The cassette CR contains a predetermined number of wafers W (either 25 or 13). A wafer W is taken out from the cassette CR by the sub-arm mechanism 21 and loaded into the process station 11.

Figure 3:
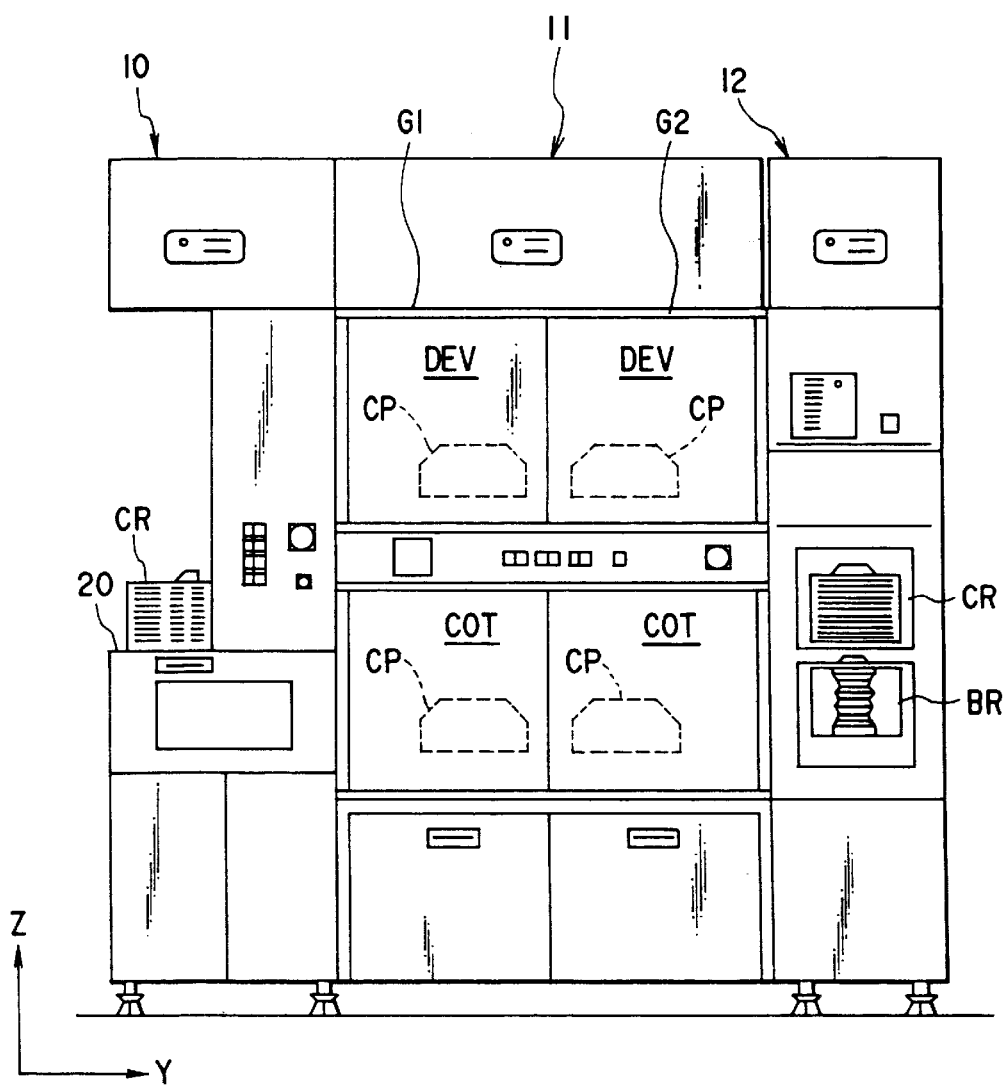
FIG. 3 is a front view of the substrate treatment system.

As shown in FIGS. 3 and 4, the process station 11 has 5 process units G1 to G5. The process units G1 to G5 are arranged in a multiple-stage vertical array. Wafers are loaded/unloaded one by one to each of the process units by the main arm mechanism 22. The interface portion 12 is interposed between the process station 11 and a light-exposure device (not shown). The wafer W is loaded/unloaded into the light-exposure device by the sub-arm mechanism 24.

Four projections 20a are provided on the cassette table 20. The projections 20a are responsible for placing the cassette CR at a predetermined position of the table 20. A cover 44 is provided to the cassette CR to be loaded into the cassette station 10. The cassette CR is positioned on the cassette table 20 in such a way that the cover faces the process station 11.

The process station 11 has 5 process units G1, G2, G3, G4 and G5. The first and second process units G1 and G2 are arranged in the front side of the system. The third process unit G3 is positioned adjacent to the cassette station 10. The fourth process unit G4 is positioned next to the interface portion 12. The fifth process unit G5 is positioned in the rear side of the system.

The main arm mechanism 22 has moving mechanisms along the X-axis and Z-axis and a rotating mechanism about the Z axis by angle θ. The main arm mechanism 22 receives the wafer W from the first sub-arm mechanism 21 and then transfers the wafer W to an alignment unit (ALIM) and an extension unit (EXT) belonging to the third process unit G3 in the process station 11.

As shown in FIG. 3, in the first process unit G1, two spinner type process units are provided in which predetermined processing is respectively applied to the wafer mounted on a spin chuck in the cup (CP). To be more specific, a resist coating (COT) unit and a developing (DEV) unit are superposed in this order from the bottom. In the same manner, two spinner type process units, COP and DEV units are superposed in the second process unit G2. These COT units are preferably arranged in a lower position to facilitate the discharge.

As shown in FIG. 4, the third process unit G3 consists of 8 layers, that is, a cooling (COL) unit, an adhesion unit, an alignment(ALIM) unit, an extension (EXT) unit, prebaking (PREBAKE) units, and post baking (POBAKE) units. They are superposed in this order from the bottom. In the same manner, the fourth process unit G4 consists of 8 layers, that is,. a cooling (COL) unit, an extension cooling (EXTCOL) unit, an extension (EXT) unit, a cooling unit (COL), prebaking (PREBAKE) units, and postbaking (POBAKE) units.

Since the COL and EXTCOL units responsible for low-temperature processing are placed in the lower stage and PREBAKE, POBAKE, and AD units responsible for high temperature processing are placed in the upper stage, thermal interference between the units can be lowered.

The size in the X-axis direction of the interface portion 12 is almost equal to that of the process station 11. However, the size in the Y-axis direction is smaller than that of the process station 11. In the front portion of the interface portion 12, an immobile buffer cassette BR is arranged. In the rear portion, a peripheral light exposure device 23 is positioned. In the center portion (in the vertical direction), the second sub-arm mechanism 24 is provided. The second sub-arm mechanism 24 has the same moving mechanisms as those of the first sub-arm mechanism 21. The second sub-arm mechanism can access to the EXT unit belonging to the forth process unit G4 and to the adjoining wafer transfer portion (not shown) provided on the light exposure side.

In the coating and developing process system 1, the fifth process unit G5 may be arranged on the back side of the main wafer transfer mechanism 22. The fifth process unit G5 can be moved in the Y-axis direction along a guide rail 25. If the fifth process unit G5 is moved, an enough space can be given for performing maintenance and inspection of the main arm mechanism 22 from the back side.

As shown in FIG. 5, a transfer chamber 31 of the cassette station 10 is shut out from a clean-room atmosphere by means of a first vertical partition board 32. In the lower portion of the first vertical partition board 32, a gate block 60 is provided. In the gate block 60, an upper opening passage (tunnel) 33a and a lower opening (storage room) 33b are formed. In the space made of these upper and lower openings 33a and 33b, a cover-removing mechanism 47 is provided. In the passage 33a, a cover 44 is removed from the cassette CR by means of the cover-removing mechanism 47 and stored in the storage room 33b for a while.

The cassette station 10 and process station 11 are separated from each other by a second vertical partition board 35. The second vertical partition board 35 has a communication passage 36 with an open/close shutter 37.

In the space between the first and second partition boards, the first sub-arm mechanism 21 is provided. The first sub-arm mechanism 21 comprises an X-axis moving mechanism 42 for moving the arm 21a in the X direction, a Y-axis moving mechanism 39 for moving the arm 21a in the Y direction, and a Z-axis moving and rotating mechanism 40 for moving the arm 21a in the Z direction and rotating the arm 21a about the Z-axis. A wafer W is taken out from the cassette CR by the first sub-arm mechanism 21 through the passage (tunnel) 33a of the gate block 60 and loaded into a process station 11 through the passage 36 of the second partition board 35.

Hereinbelow, the cassette table 20 and the cover removing mechanism 47 will be explained with reference to FIGS. 6, 7, 8A to 8M, 11 and 15.

To the cassette table 20, a movable base 80 is provided which is connected to a rod 82a of a Y-axis cylinder 82. On the middle of the upper surface of the movable base 80, the projection 20a is provided. When the cassette CR is mounted on the cassette table 20, the projection 20a is engaged with a depression (not shown) formed on the bottom of the cassette CR. In this manner, the cassette CR is positioned at a predetermined position. The projection 20a has a touch sensor function. Hence, when the cassette CR is placed on the cassette table 20, the presence of the cassette CR is detected by the sensor. The detection signal is sent from the touch sensor to a controller 59.

As shown in FIG. 6, the cover-removing mechanism 47 has a shutter board 49 and an elevator mechanism 52. The elevator mechanism 52 comprises a pair of linear guides 48, a ball screw 53, and a motor 55. The linear guides 48 are provided vertically on sides of both the upper opening (tunnel) 33a and the lower opening 33b. Nuts 49a are provided on the left and right end portions of the shutter board 49 and respectively connected to linear guides 48. The nuts 49a are screwed on the ball screw 53. A gear 54 of the screw 53 is engaged with a movement gear 56 of the motor 55. The shutter board 49 can be moved through a space in the Z direction from the passage(tunnel) 33a to the storage room 33b by means of the elevator mechanism 52. It should be noted that an air cylinder may be employed as the elevator mechanism 52.

The shutter board 49 has a pair of keys 50. Each of the keys 50 is supported by a θ' rotation mechanism (not shown). Each of the keys 50 is provided on the shutter board 49 so as to correspond to each of key holes 45 formed in the cassette cover 44 shown in FIG. 11. As shown in FIG. 15, when the key 50 is inserted in the key hole 45 and rotated by an angle of θ', a lock piece 249 engaged with a key groove of the key hole 45. In this manner, the cassette cover 44 is locked on the shutter board 49.

Figure 7:
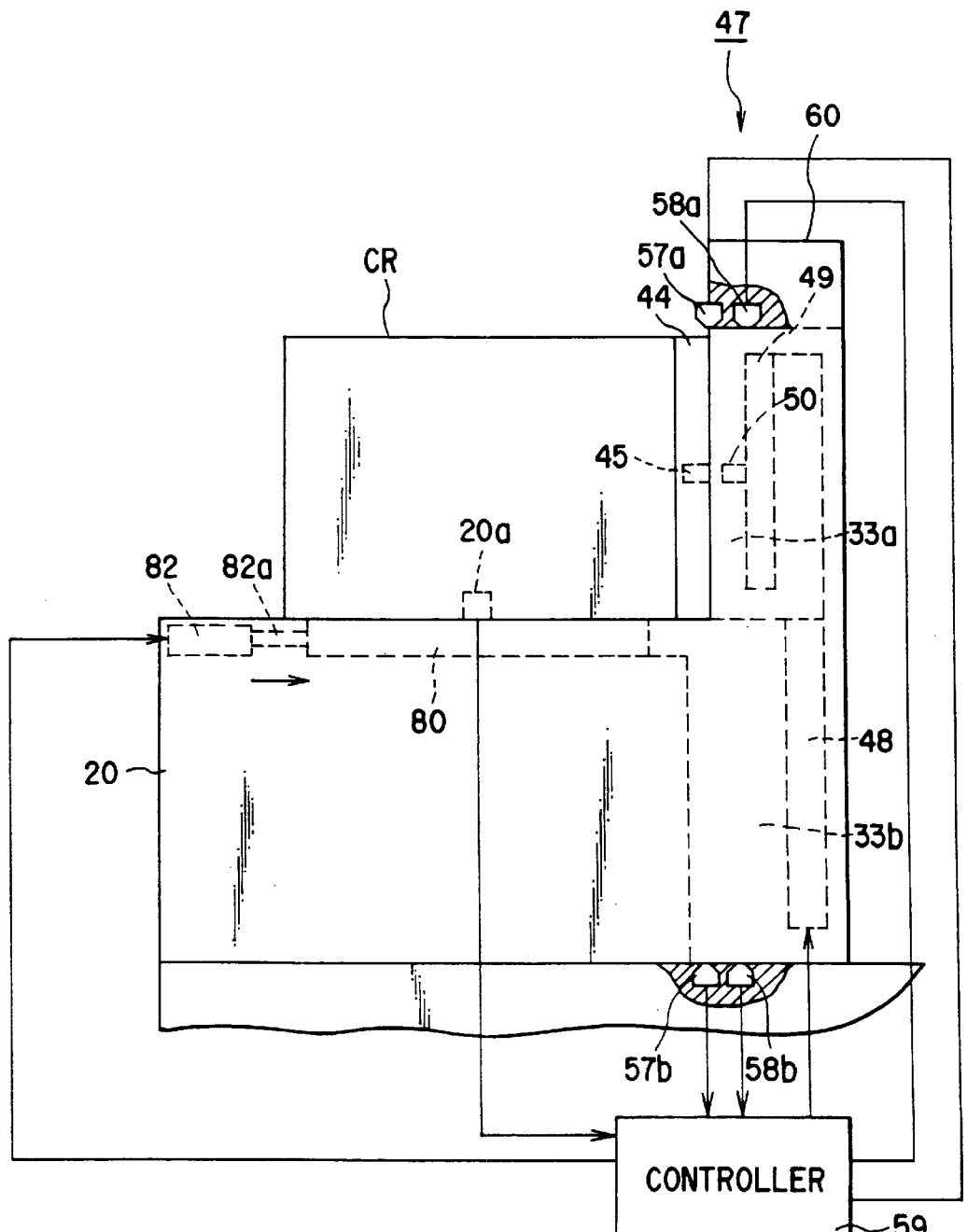
FIG. 7 is a block diagram of first and second position sensors for detecting the position of the front end protion of a cassette and for detecting a wafer protruding from a cassette, respectively.

As shown in FIG. 7, first optical sensors 57a and 57b are provided above and below the gate block 60, respectively, in such a way that the optical axis formed between the sensors crosses the front portion of the cassette CR set on a second position. The second optical sensors 58a and 58b are provided above and below the gate block 60, respectively, in such a way that the optical axis formed between the sensors crosses the front portion of the cassette CR set on a third position.

The controller 59 controls the movements of the Y-axis cylinder 82 on the cassette table 20 and the motor 55 of the cover-removing mechanism 47 on the basis of detection data sent from the touch sensor 20a and the first and second optical sensors 57a, 57b, 58a and 58b.

Figures 8G, 8H:
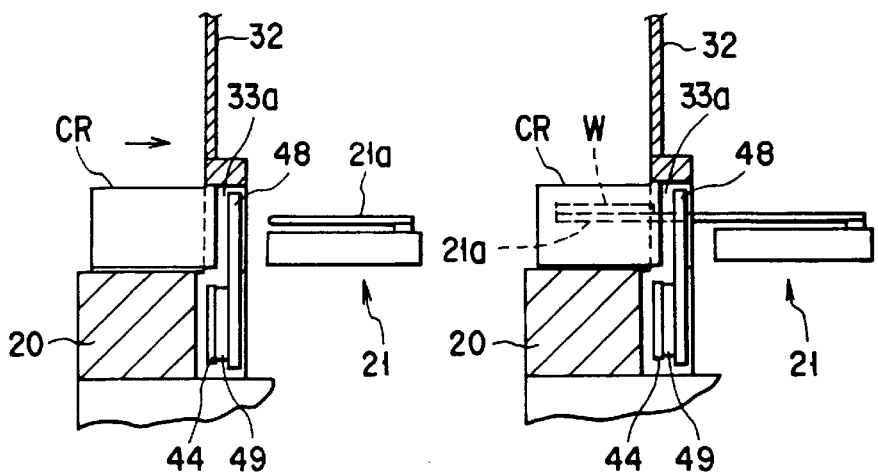

As shown in FIG. 8B, the initial position of the cassette CR at which the cassette CR is placed for the first time on the cassette table 20 is defined as "a first position". As shown in FIG. 8F, the position at which the cassette CR is moved backward from a removed cover 44 is defined as a "second position". Furthermore, the position of the cassette CR when the cover 44 is removed from the cassette CR (shown in FIGS. 8D and 8L) and the position of the cassette CR with the cover 44 removed (shown in FIGS. 8G to 8I) when the wafer W is taken out from the cassette CR is defined as "a third position".

The cover 44 of the cassette CR at the first position is located on an entrance (front end portion) of the passage (tunnel) 33a. The controller 59 detects whether the cassette CR is positioned at the first position or not on the basis of the detection data sent from the touch sensor 20a and the first and second optical sensors 57a, 57b, 58a and 58b.

The first sensors 57a and 57b are responsible for detecting the wafer Wh protruding from the cassette without the cover. The second sensors 58a and 58b are responsible for detecting the protruding wafer Wh from the cassette CR in order to prevent the interference between the first sub arm mechanism 21 and the wafer Wh.

Hereinafter, the operation of the cover-removing mechanism 47 will be explained with reference to FIGS. 8A to 8M and FIG. 9.

Before the cassette CR is mounted on the cassette table 20, a shutter board 49 of the cover removing mechanism 47 is positioned on a passage (tunnel) 33a, as shown in FIG. 8A. The atmosphere inside the transfer chamber 31 is isolated from that of the clean room.

As shown in FIG. 8B, when the cassette CR is mounted on the cassette table 20, the projection 20a is engaged with a depressed portion (not shown) of the cassette bottom. In this manner, the cassette CR is positioned at the first position.

As shown in FIG. 8C, the cassette CR is moved forward from the first position to the third position. In this way, the cassette cover 44 is pressed against the shutter board 49. Then, as shown in FIGS. 8D, 11, and 15, the key 50 is inserted into the key hole 45 and turned to lock the shutter board 49 to the cover 44. In this manner, the cassette cover 44 and the shutter board 49 are made into one body.

As shown in FIG. 8E, the cassette CR is moved back from the third position to the second position to remove the cover 44 from the cassette CR. Subsequently, as shown in FIG. 8F, the cover 44 is descended together with the shutter board 49 to house the cover 44 in the storage room (the lower opening) 33b.

In the second position, since the front portion of the cassette CR is within the passage (tunnel) 33a, the atmosphere in the cassette communicates with that of the process system 1 and the cassette CR cannot be raised from the cassette table 20 during the processing of the wafer W. Therefore, it is possible to prevent an accident in which an operator mistakenly picks up the cassette CR during the processing and interrupts the operation.

As shown in FIG. 8G, the cassette CR is then moved forward from the second position to the third position to arrange a front distal end portion of the cassette CR to the place to which the arm 21a of the first sub-arm mechanism accesses. By virtue of the presence of the cassette CR, the atmosphere of the transfer chamber 31 is shut out from that of the clean room with the result that particles are prevented from entering the process system 1 through the passage 33a.

Figures 8I, 8J, 8K:
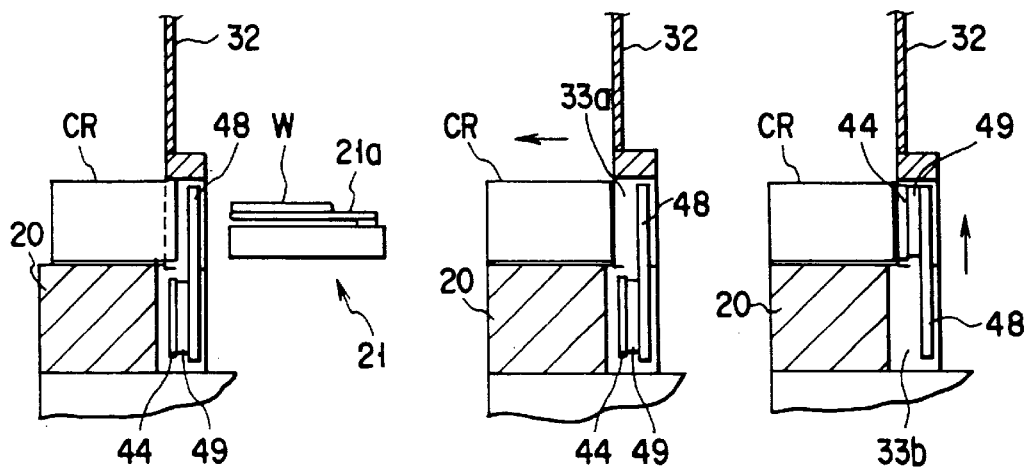
Figure 9:
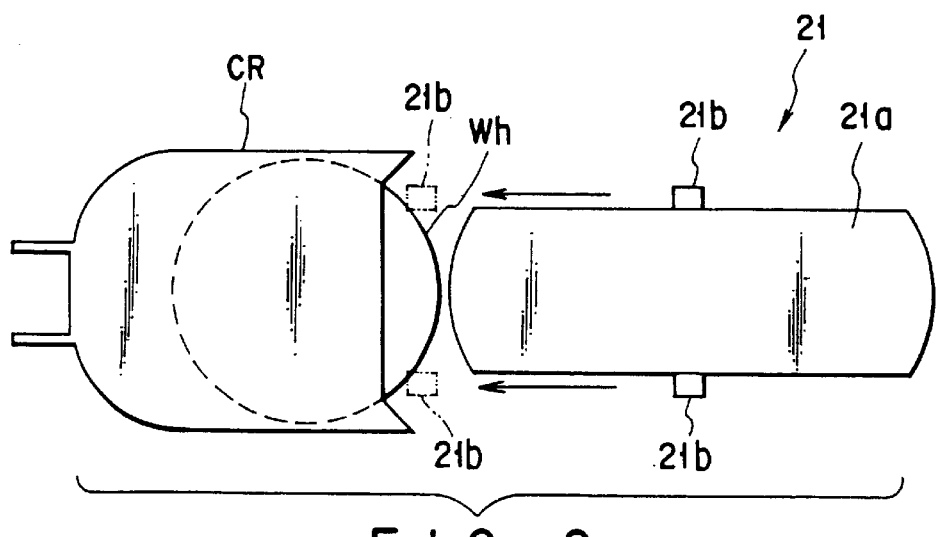
FIG. 9 is a plan view of a protruding wafer and a mapping sensor, showing a case where a wafer protruding from a cassette interfers with the mapping sensor.

As shown in FIGS. 8H and 8I, the arm 21a of the first sub-arm mechanism 21 is inserted into the cassette CR and takes out the wafer W from the cassette CR. As shown in FIG. 9, to the arm 21a of the first sub arm mechanism 21, a pair of mapping sensors 21b are movably provided. When the mapping operation is made, these sensors 21b are designed to move to the distal end of the arm 21a. Due to these structures, if there is a wafer Wh protruding from the cassette CR, the sensor 21b hits against the protruding wafer Wh, causing not only misoperation of the mapping but also damage of the wafer Wh. When the wafer Wh protruding from the cassette CR is detected by the first sensors 57a and 57b, the detection signal is sent to the controller 59, the mapping operation is immediately stopped with the sound of an alarm to avoid mutual interference between the protruding wafer Wh and the sensor 21b. The operator checks the wafer Wh in the cassette CR and returns the wafer Wh to a right position. Thereafter, the operator pushes a reset button to restart the processing operation. The protruding wafer Wh may be pushed into the cassette CR by a wafer pushing mechanism which will be described later (see FIGS. 23 to 25) instead of manual operation by the operator.

The wafer W is loaded from the cassette station 10 into the process station 11, processed through individual units of the process station 11, exposed light in the light-exposure device, and returned to the cassette CR of the cassette station 10, again.

After completion of processing all wafers W in the cassette CR, the cassette CR is moved back from the third position to the second position. Since the cassette CR is located at the second position, mutual interference between the cover 44 and the cassette CR can be prevented even if the cover 44 is ascended from the storage room 33b to the passage 33a.

Figure 8L:
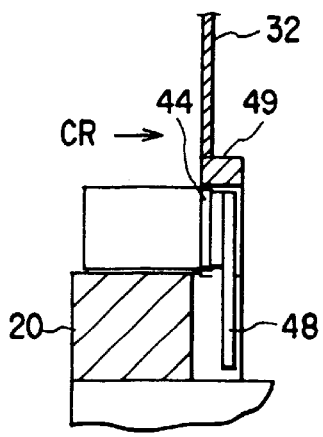

As shown in FIG. 8K, the cover 44 is ascended together with the shutter board 49 until the cover 44 comes to the passage 33a. Subsequently, as shown in FIG. 8L, the cassette CR is moved forward from the second position to the third position. As a result, the opening portion of the cassette CR is pressed to the cover 44. In this manner, the cover fits into the opening of the cassette CR.

Figure 8M:
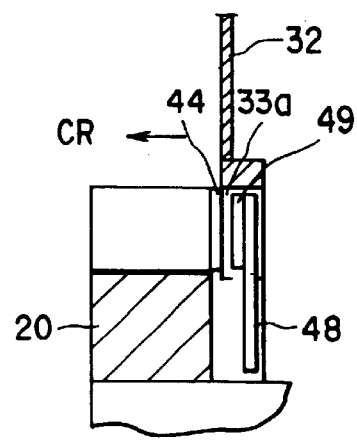

Furthermore, as shown in FIGS. 11 and 15, the key 50 is turned to release the lock between the shutter board 49 and the cover 44. As shown in FIG. 8M, the cassette CR is moved back from the third position to the first position to take the cover away from the shutter board 49. The cassette CR is then unloaded from the station 10.

According to the aforementioned device, the shutter board 49 shuts up the passage 33a when no operation is made and the cassette CR shuts up the passage 33a when the operation is made. It is therefore difficult for particles to enter the system from the clean room.

Since the cassette CR is moved forward and backward toward the passage 33a by the Y-axis cylinder 82, it is not necessary to provide the Y-axis movement mechanism to the cover removing mechanism 47. Therefore, the structure of the cover removing mechanism 47 may be simplified, reducing the amount of particles generated.

Since the wafer W is loaded to and unloaded from the cassette CR while the front end of the cassette CR is present in the passage 33a, the trouble that an operator inadvertently picks up the cassette CR from the cassette table 20 during the processing can be fully prevented.

Hereinafter, the device and method of the second embodiment will be explained with reference to FIGS. 10–18E. The part of the second embodiment common in the first embodiment will be omitted.

Figure 10:
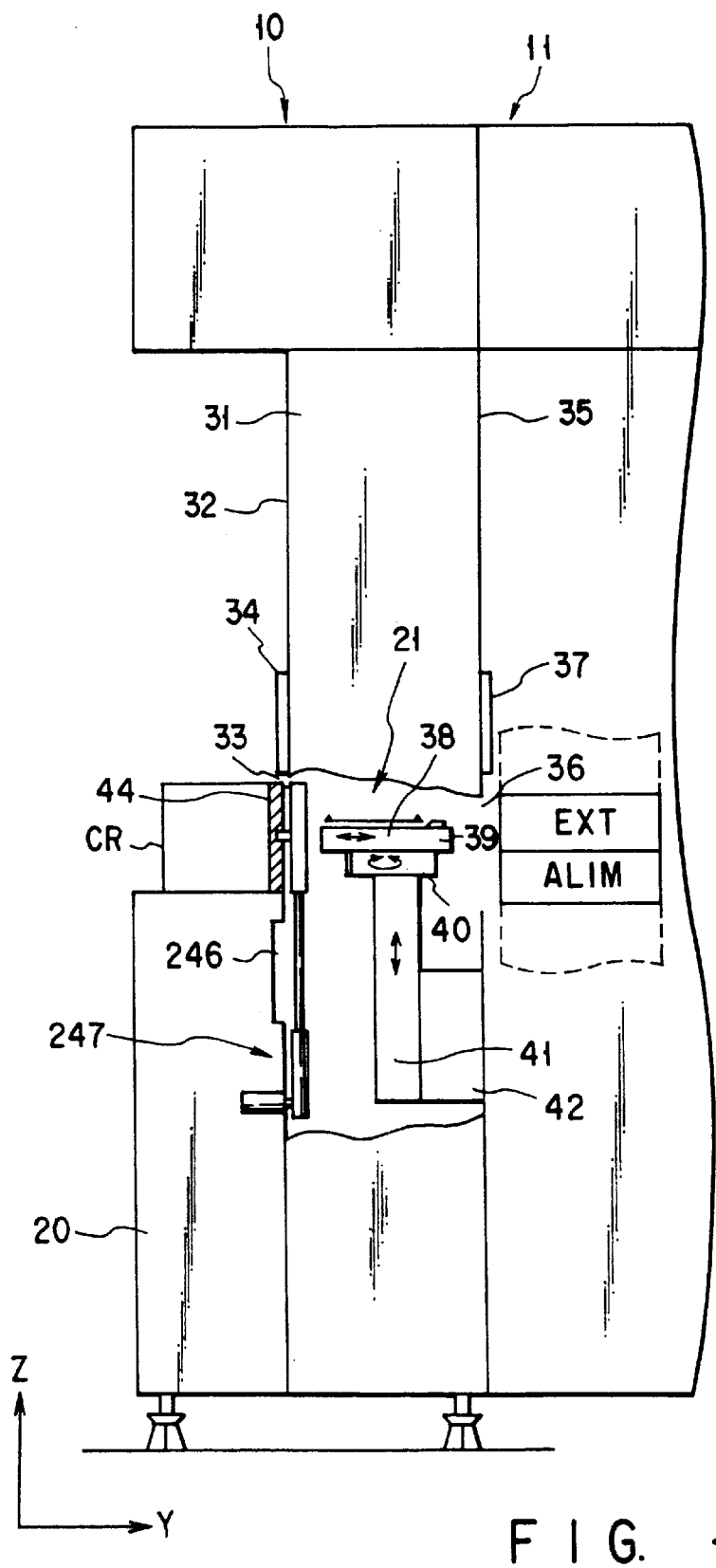
FIG. 10 is a partial perspective view of a cassette station, particlally broken away, showing a cassette-cover removing mechanism of a second embodiment.

As shown in FIG. 10, the transfer chamber 31 of the cassette station 10 is separated from the atmosphere of the clean room by a partition board 32 made of, for example, an acrylic board and a stainless steel board. On the partition board 32, four passages 33 are formed. The sub arm mechanism 21 is provided in the transfer chamber 31. The sub arm mechanism 21 is responsible for load/unload of the wafer W to the cassette CR through the passage 33. The size of the passage 33 is slightly larger than the opening 43 of the cassette CR. Above the passage 33, an open-close shutter 34 is provided. The shutter 34 is opened when the cassette CR is present on the cassette table 20 and closed when the cassette CR is not on the cassette table 20.

As shown in FIG. 11, the opening 43 is formed in the front portion of the cassette CR. The wafer W is loaded/unloaded to the cassette CR through the opening 43. The cover 44 is provided to the opening 43 in order to keep the inside of the cassette CR airtight. The cassette CR is charged with a non-oxidative gas such as a $N_2$ gas. Alternatively, $N_2$ gas charging means may be provided to the cassette table 20 to supply the $N_2$ gas or the like into the cassette CR from which the wafer is to be taken out. Inside the cover 44, lock means 44 (not shown) is provided to fix the cover to the cassette CR. On the surface side of the cover 44, two key holes 45 are formed. The distance between two key holes is desirably a half or more of a lengthwise side of the cover.

As shown FIG. 10, on the transfer chamber 31 side of the cassette table 20, four cover storage portions 246 are arranged side by side in the X-axis direction. The storage 246 is a portion for storing the cover 44 removed from the cassette CR.

On the other hand, four cover removing means 247 are provided to the transfer chamber 31. The cover removing means 247 are formed in correspondence with the cover storage portions 246. The cover 44 removed from the cassette CR is stored in the cover storage portions 246 below.

As shown in FIGS. 12 to 14, the cover removing mechanism 247 has Z-axis moving means 251 and Y-axis moving means 252. The Z-axis moving means 251 has two Z-axis cylinders 254 which synchronously move up and down. A cover transfer member 248 is supported by the Z-axis cylinders 254. Each of the Z-axis cylinders 254 is supported by the both ends of a supporting member 255. The supporting member 255 is connected to two Y-axis cylinders 256. The Y-axis cylinder 256 is provided to the cassette table 20 and designed to move the cover transfer member 248 in the Y-axis direction.

Figure 17:
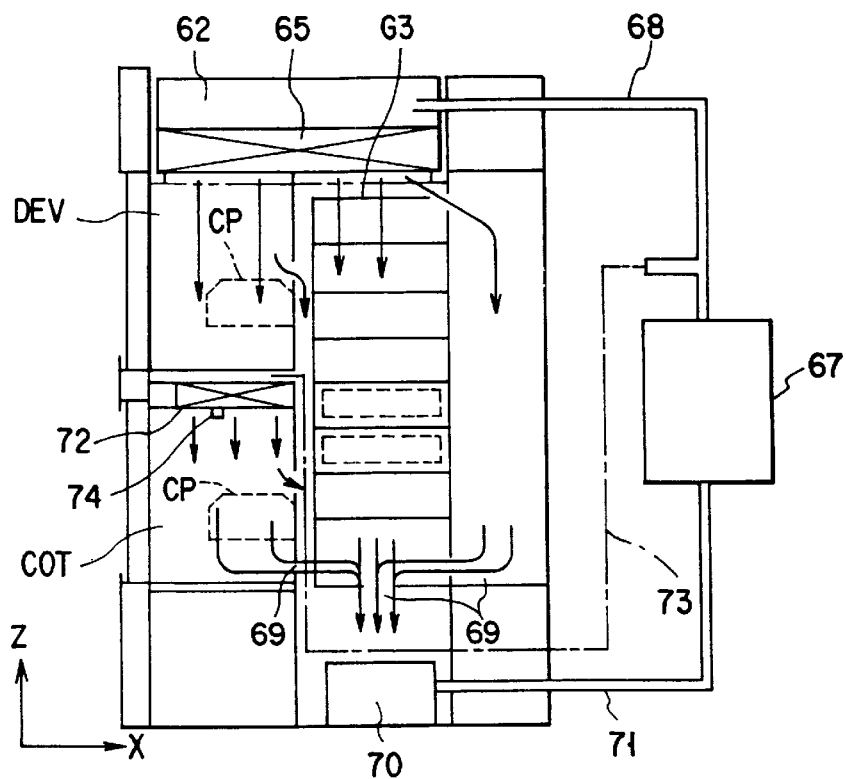
FIG. 17 is a perspective view showing a clean-air flow in the substrate treatment system.

The coating and developing process system 1 is placed in the clean room in which a clean-air flows downwardly. As shown in FIGS. 16 and 17, a clean-air downflow is also formed within the system 1 to keep individual units of the process system 1, clean. In the upper portions of the cassette station 10, process station 11 and the interface portion 12 of the system 1, air-supply chambers 61, 62 and 63 are provided. In the lower surfaces of the air supply chambers 61, 62 and 63, dustproof ULPA filters 64, 65 and 66 are provided.

As shown in FIG. 17, an air-conditioning 67 is provided on the outside or the backside of the process system 1. Air is introduced into the air-supply chambers 61, 62 and 63 from the air-conditioning 67 by way of a pipe 68. The introduced air is converted into clean air by means of the ULPA filters 64, 65 and 66 provided in the individual air-supply chambers. The clean air is supplied downwardly to the portions 10, 11 and 12. The down-flow air is collected at a vent 70 through the air holes 69 appropriately provided in the lower portion of the system. The air is returned to the air conditioning 67 from the vent 70 through the pipe 71.

In the ceilings of the resist coating unit (COT),(COT) positioned lower portion of the first and second process units G1 and G2 in the process station 11, an ULPA filter 72 is provided. Air from the air-conditioning 67 is sent to the ULPA filter 72 by way of a pipe 73 branched from the pipe 68. In the middle of the pipe 73, a temperature/humidity controller (not shown) is provided for supplying clean air to the resist coating unit (COT) (COT). The controller controls the clean air so as to have a predetermined temperature/humidity suitable for the resist coating step. A temperature/humidity sensor 74 is provided in the proximity of the blow-out port of the ULPA filter 72. The data obtained by the sensor is fed-back to the control portion of the temperature/humidity controller to control the temperature/humidity of the clean air accurately.

In FIG. 16, in the side wall of each of spinner-type process units such as COT and DEV, facing the main wafer transfer mechanism 22, openings DR are formed trough which the wafer and the transfer arm go in and out. Furthermore, to each of the openings DR, a shutter (not shown) is provided to prevent particles or the like from entering the space on the side of the main arm mechanism 22.

The amounts of air supplied or exhausted to the transfer chamber 31 are controlled by the air conditioning 67. By this control, the inner pressure of the transfer chamber 31 is set higher than the inner pressure of the clean room. It is therefore possible to prevent the formation of the air flow from the clean room and the cassette CR to the transfer chamber 31. As a result, particles are successfully prevented from entering the transfer chamber 31. Since the inner pressure of the process station 11 is set higher than the inner pressure of the transfer chamber 31, the formation of air flow from the transfer chamber 31 to the process station 11 can be prevented. As a result, particles are successfully prevented from entering the process station 11.

Hereinbelow, movement of the cover removing mechanism 247 will be explained with reference to FIGS. 18A to 18E. Movement of the cover-removing mechanism 247 is controlled by a controller 59 shown in FIG. 7.

Figure 18A:
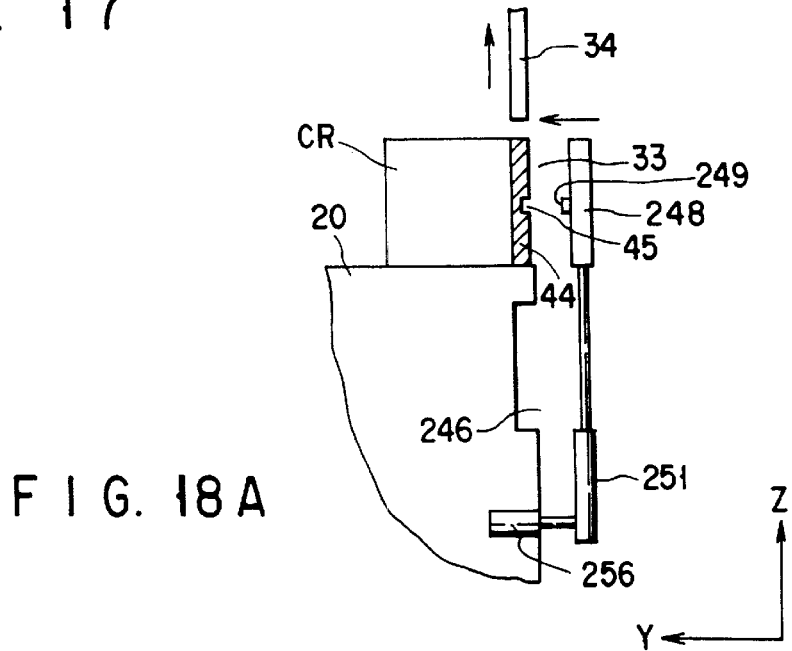
FIGS. 18A to 18E show a series of procedures for removing a cassette-cover according to the second embodiment, sequentially.
Figure 18B:
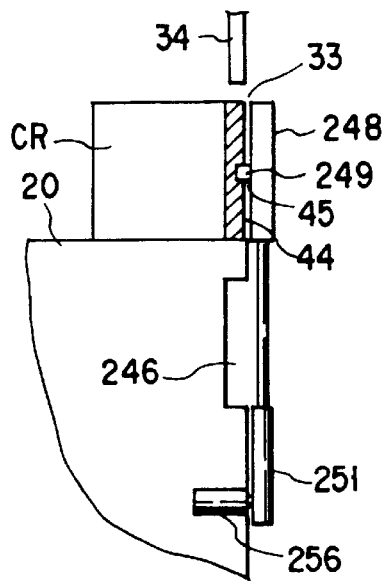

As shown in FIG. 18A, the shutter 34 is opened and the cassette CR is mounted on the cassette table 20. Then, the cover transfer member 248 is moved forward to the passage 33 by an Y-axis movement mechanism 256. Thereafter, as shown in FIG. 18B, the key 249 for the cover-transfer member 248 is inserted in the key hole 45 of the cover 44 and locked to each other through an inner lock mechanism. The key 249 is rotated by an angle θ', thereby releasing the lock between the cover 44 and cassette CR. In this manner, the cover 44 can be removed from the cassette CR.

Figure 18C:
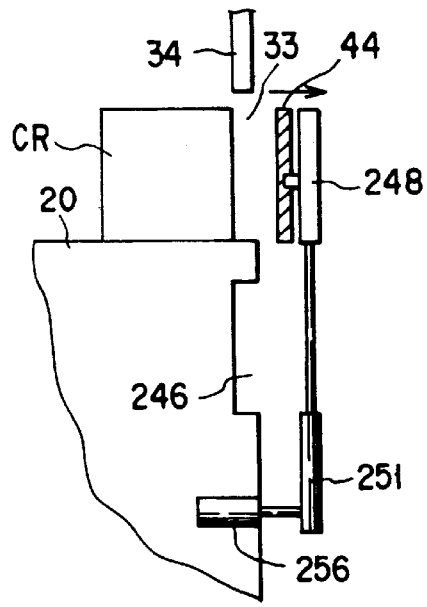
Figure 18D:
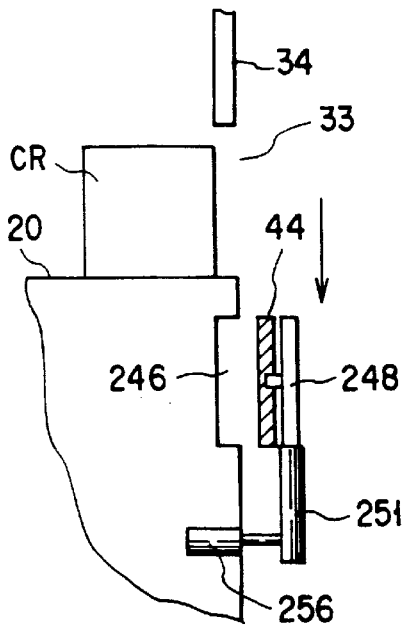
Figure 18E:
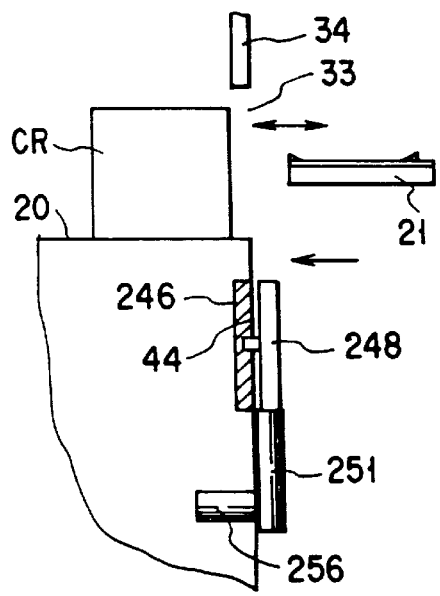

As shown in FIG. 18C, the cover transfer member 248 is then moved back together with the cover 44 in the Y-axis direction to load the cover into the transfer chamber 31 through the passage 33. The cover transfer member 248 is descended together with the cover 44, as shown in FIG. 18D, by means of a Z-axis direction moving mechanism 251 to the position facing the storage portion 246. Then, as shown in FIG. 18E, the cover transfer member 248 is moved forward in the Y-axis direction to store the cover 44 in the storage portion 246.

Thereafter, the wafer W is taken out from the cassette CR by means of the sub-arm mechanism 21 and transferred to the process station 11. After the wafer W is processed in individual process units, the wafer W is returned to the cassette CR. After the processing of all wafers housed in the cassette CR is completed, the cover 44 is transferred from the storage portion 246 to the passage 33 to put the cover on the opening of the cassette CR. The cassette CR is covered with the cover 44, locked and transferred outside the system 1.

In the aforementioned process system 1, the clean air downwardly flowing in the transfer chamber 31 is not disturbed by the attach and detach movement of the cover 44 from the cassette CR.

Since the cover is housed in the storage portion 246, the cover 44 itself does not disturb the down flow of the clean-air in the transfer chamber 31. Therefore, deficiency of manufactured products due to particles can be reduced.

A third embodiment of the present invention will be explained with reference to FIGS. 19–21.

Figure 19:
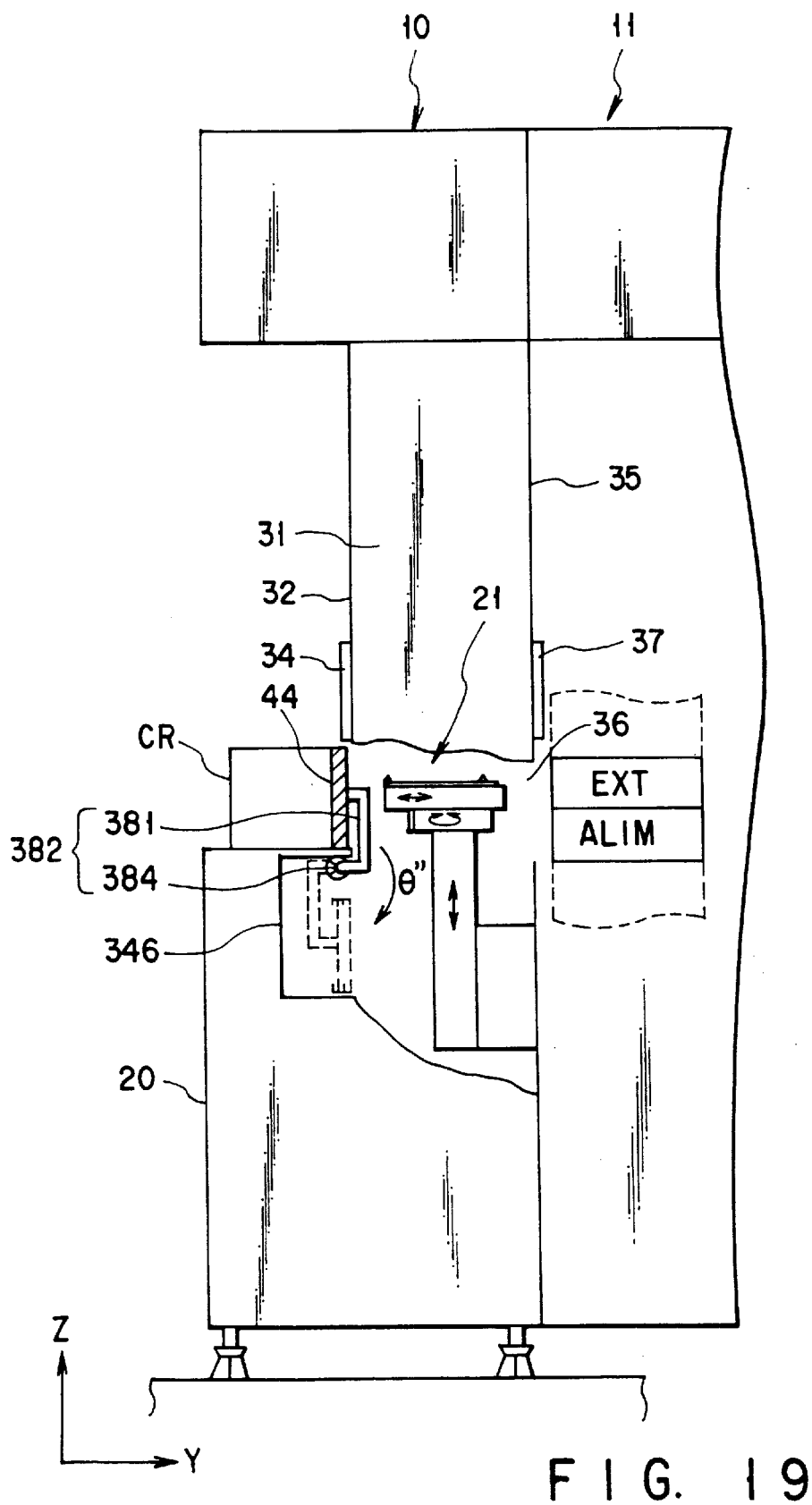
FIG. 19 is a perspective cross-sectional view of a cassette station, particlly broken away, showing a cassette-cover removing mechanism of a third embodiment.
Figure 20:
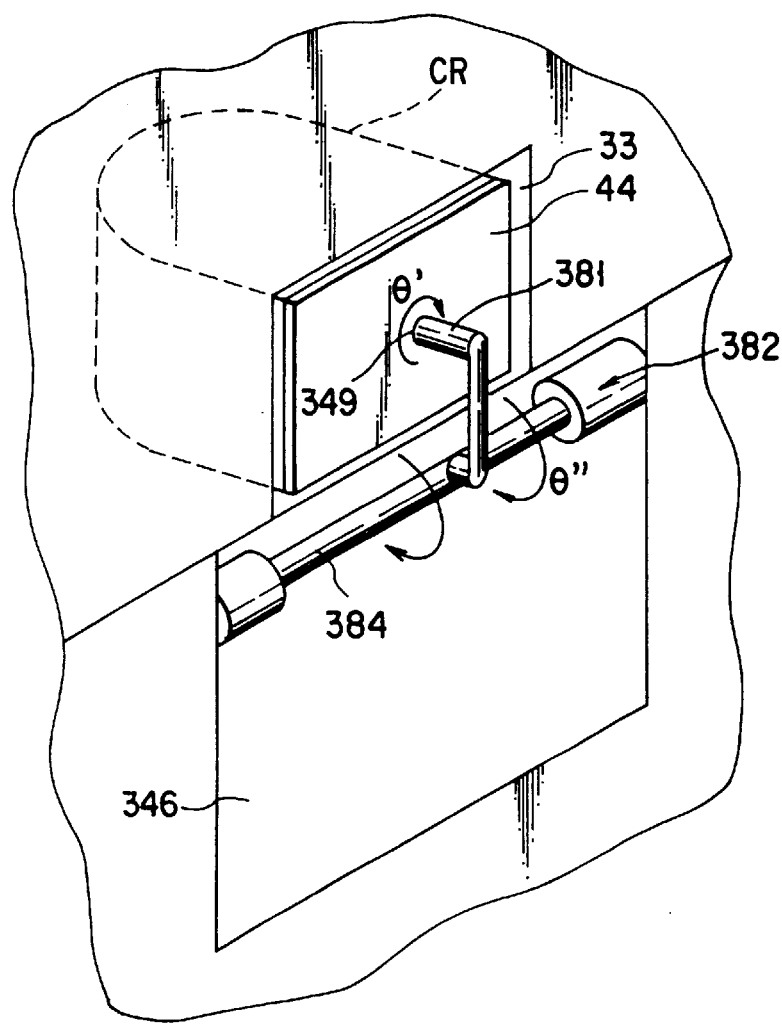
FIG. 20 is a perspective view of a cassette-cover removing mechanism of a third embodiment.

In the system of the third embodiment shown in FIGS. 19 and 20, the cover removed from the cassette CR is rotated about a horizontal axis 384 by 180 degrees by means of a rotation mechanism 382 and then housed in a storage portion 346. The rotation mechanism 382 comprises a U-shape arm member 381, a key 349, a horizontal supporting axis 384, θ' rotation motor (not shown), and θ" rotation motor (not shown). The key 349 is provided to one end of the U-shape arm member 381. The θ' rotation motor is used for rotating the key 349 by an angle of θ'. The θ" rotation motor is used for rotating the key 349 by an angle of θ", together with the horizontal support axis 384 and the U-shape arm member 381.

Figure 21:
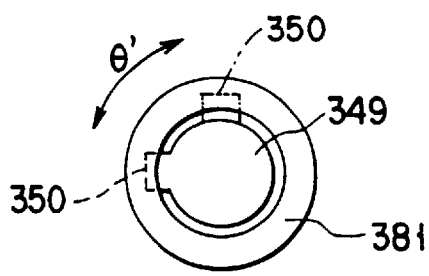
FIG. 21 is a transverse cross sectional view of a lock key of a cassette-cover removing mechanism of a third embodiment.
Figure 22:
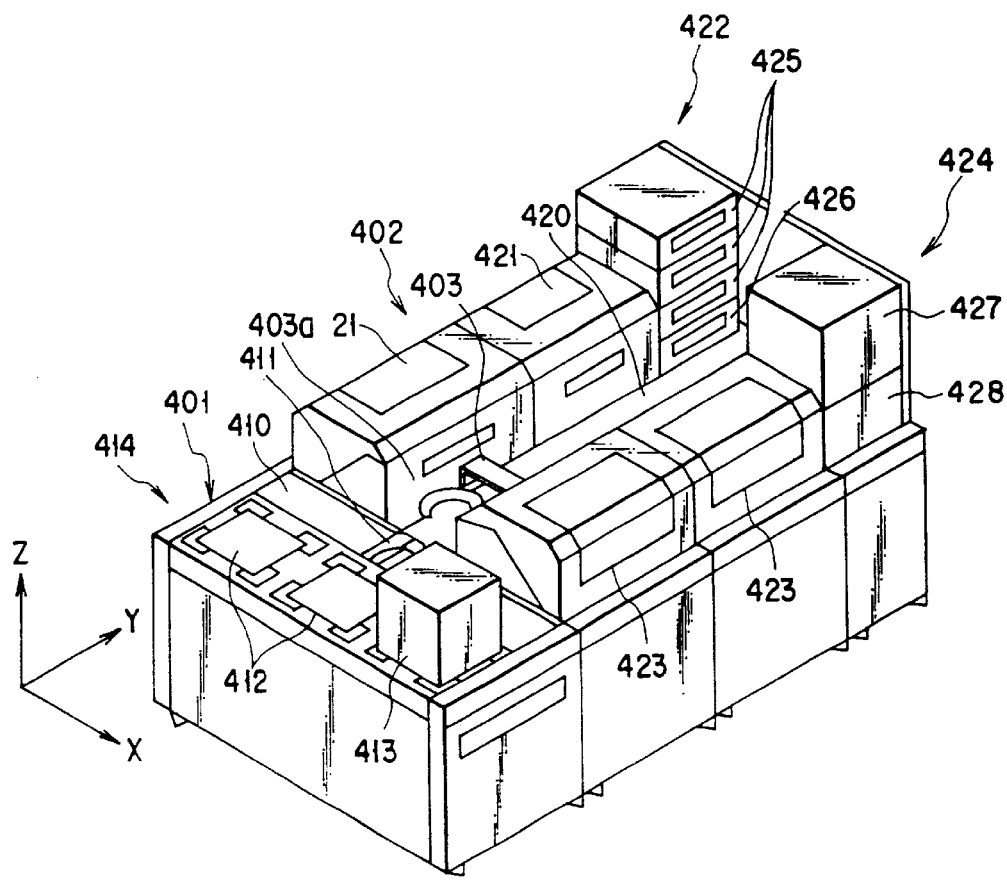
FIG. 22 is a schematic perspective view of a substrate treatment system.

As shown in FIG. 21, the key 349 is rotatably provided in the arm member 381. When the key 349 is inserted in the key hole 45, a lock piece 350 is engaged with a key groove. When the key 349 is rotated by angle θ', the lock between the cover 44 and the cassette CR is released. In this manner, the cover 44 becomes detachable from the cassette CR. When the horizontal support axis is rotated by angle θ", a cover 44 is rotated by 180 degrees and housed in the storage portion 346. As described above, in the system according to the third embodiment, the cover can be housed in a simplified mechanism.

The embodiments mentioned above are concerned with a resist coating and developing process system used in the photolithography step of the semiconductor device manufacturing process. The present invention is applicable to other process systems. The substrate to be processed is not limited to a semiconductor wafer. Examples of applicable substrates include an LCD substrate, a glass substrate, a CD substrate, a photomask, a printing substrate, a ceramic substrate and the like.

According to one aspect of the present invention, even if the cover is opened or shut at the opening portion of the cassette, the clean-air downflow will not be disturbed by the open/shut movement. Deficiency in manufactured products due to particles can be reduced.

According to another aspect of the present invention, even if the cover is opened or shut at the opening portion of the cassette, the clean-air downflow will not be disturbed. In addition, particles can be prevented from attaching to a substrate in a transfer room and in a process chamber. As a result, deficiency in manufactured products due to particles is successfully prevented.

According to still another aspect of the present invention, no particles flow out from the cassette side to the device side.

According to a further aspect of the present invention, no particles flow out from the clean room and the cassette to the device side.

According to a still further aspect of the present invention, no particles flow out from the transfer room to the process chamber 31A.

Hereinbelow, a fourth embodiment of the present invention will be explained with reference to FIGS. 22 to 27. In the fourth embodiment, the present invention is applied to a substrate washing process system having a scrubber for brush-washing a semiconductor wafer W.

The substrate washing process system comprises a cassette station 401 and a washing process station 402 having a plurality of units. The cassette station 401 comprises mounting portions 414 for mounting airtight containers (SMIF POD) 413 having cassettes C. A plurality of wafers W are stored in each cassette C. In the cassette station 401, the wafer W is transferred to other system, and to the washing process station 402, and vice versa.

On the mounting portion 414, three mounting boards are provided. Each board has a table 412 for mounting the cassette thereon. Below the mounting portion 414, a wafer-transfer portion 415 (described later) is formed. On the side of the washing process portion 402 of the cassette station 401, a passage 410 is provided in the arrangement direction of the table 412. The cassette station arm 411 is provided to the passage 410 which moves therealong. The wafer W is transferred from cassette C present in the wafer transfer portion 415 to the washing process station 402, and vice versa, by means of the cassette station arm 411. The passage 410 is covered with a cover (not shown) and shut out from the atmosphere of the clean room.

In the middle of the washing process station 402, a passage 420 is provided. The passage 420 crosses the passage 410 at a right angle. The washing process station 402 comprises a plurality of units arranged on both sides of the passage 420. To be more specific, on one side of the passage 420, two surface washing units 421 and thermal system units 422 are arranged side by side. On the other side of the passage 420, two rear-surface washing units 423 and reverse-turn units 424 are juxtaposed. The thermal system units 422 consist of four units layered one on top of another. The three units from the above are heating units 425. The lowermost one is a cooling unit 426. The reverse-turn units 424 consist of two units. The upper reverse-turn unit 427 plays a part of turning over the wafer W. The lower reverse-turn unit 428 has an alignment mechanism of the wafer W other then the turn-over mechanism of the wafer W.

The washing process station 402 has a wafer-transfer mechanism 403 which is movable along the passage 420. The transfer mechanism 403 has a transfer main arm 403a, rotatable and movable back and forth and up and down. The main arm 403a is responsible for transferring the wafer W to the cassette station arm 411 and to each of units, and vice versa, and further responsible for load/unload of the wafer to each of units. Note that the entire system is covered with a wrapping cover (not shown).

Hereinbelow, the cassette station 401 will be explained in detail with reference to FIGS. 23 and 24.

The cassette station 401 has a substrate transfer portion 415 in an airtight space 416 below the mounting portion 414. On the mounting portion 414, an elevator table 412 is provided for receiving the cassette C accommodated in the airtight container 413. The airtight container 413 has a lock mechanism (not shown) responsible for maintaining the cassette C under airtight conditions. In the cassette C, wafers W are placed horizontally and arranged vertically.

When the airtight container 413 is placed on the mounting portion 414 and then the lock mechanism is released, the cassette C is ready to move together with the elevator table 412 to the wafer transfer portion 415. In this case, the space between the airtight chamber 413 and the box forming the airtight space 416 is maintained airtight.

The elevator table 412 is movably supported by the elevator 430. The cassette C is designed to move up and down by the elevator 430 between the mounting portion 414 and the wafer transfer portion 415 in the airtight space 416. The elevator 430 comprises a support member 431 for supporting the elevator table 412, a ball screw 432 for engaging with the support member 431, a stepping motor 434 for rotating the ball screw 432, and a guide member 433.

As shown in FIG. 24, the elevator table 412 is descended by the elevator 430 until the cassette C faces the wafer transfer portion 415. The wafer W is transferred to the process portion 402 by the cassette station arm 411. Since the passage 410 is covered with a cover 410a, the passage 410 is an airtight space communicable with the airtight space 416 and further communicable with airtight space, passage 420, as mentioned above. Therefore, the wafer W is washed in a series of washing processes without exposed to outer air.

Figure 25:
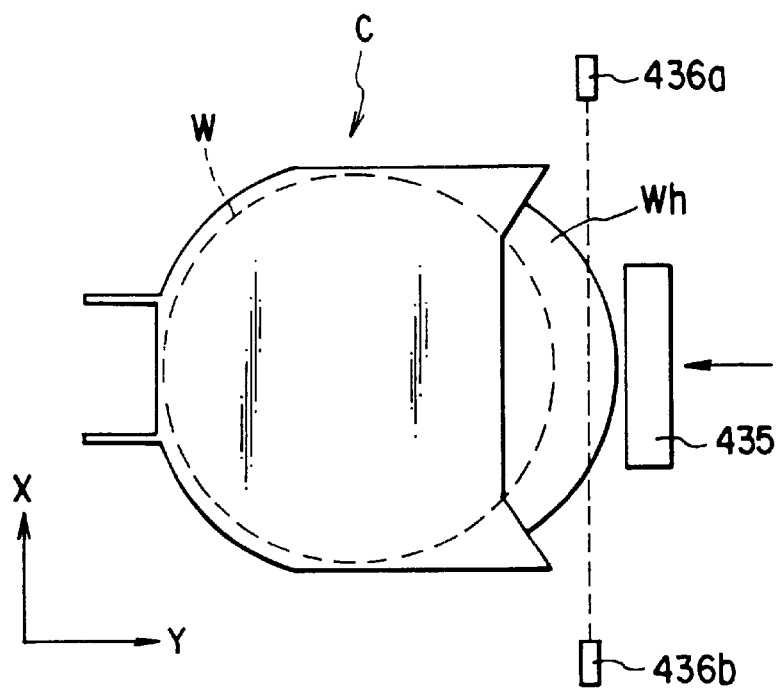
FIG. 25 is a schematic plan view of a protruding wafer and a wafer pushing member for explaining procedures of detecting a wafer protruding of a cassette and of pushing the wafer into the cassette.

Above the airtight space 416, a pushing member 435 is provided for pushing the wafer into the cassette from the wafer transfer side. In the proximity of the pushing member 435, a light emitting portion 436a and a light receiving portion 436b (serving as a first detection device) are provided so as to bridge the surface of the wafer transferred from the cassette C, as shown in FIG. 25. If there is a wafer Wh protruding from the cassette C, the protruding wafer Wh intervenes in light traveling from the light emitting portion 436a to the light receiving portion 436b. In this manner, the protruding wafer Wh can be detected. To the upper and lower portions on the side of the airtight space 416 from which the cassette is transferred, a light emitting portion 437a and a light receiving portion 437b serving as a second detection device are provided. When the light traveling from the light emitting portion 437a to the light receiving portion 437b is intervened, subsequent movement is immediately stopped.

Figure 26:
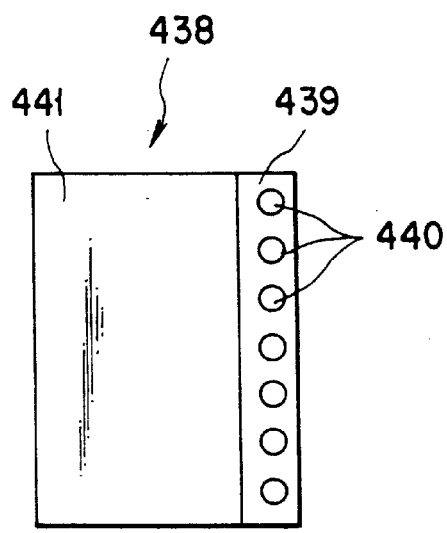
FIG. 26 is a plan view of a gas-supply nozzle for supplying an inert gas into an airtight container placed on the cassette table of the cassette station.

On the back side of the cassette C in the upper portion of the airtight space 416, a gas supply nozzle 438 is provided. When the cassette C is not present in the airtight container 413, the airtight container 413 is purged with a non-oxidative gas such as a nitrogen gas supplied from the nozzle 438 to eliminate particles or the like almost completely. The nozzle 438 comprises a nozzle head 439 having a plurality of gas releasing holes 440 arranged along the X-axis and a supporting portion 441 for supporting the nozzle head 439, as shown in FIG. 26.

Figure 27:
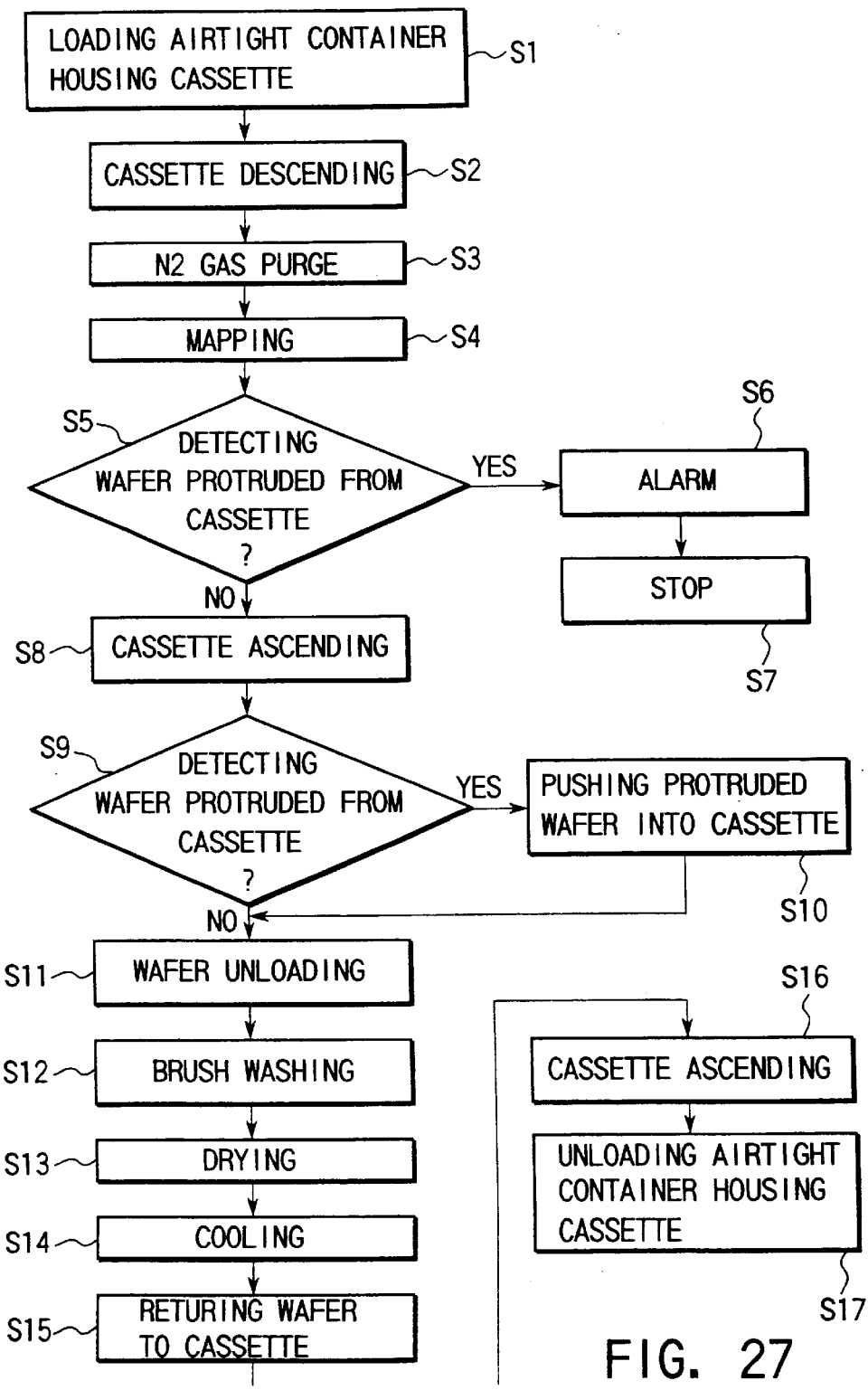
FIG. 27 is a flow chart of a substrate transfer method according to Embodiments of the present invention.

Hereinbelow, the movement of the above-mentioned device will be explained with reference to FIG. 27.

The airtight container 413 housing a cassette C is loaded into the cassette station 401 and placed on the mounting portion 414 (S 1). After the lock between the airtight container 413 and the cassette C is released, the cassette C is transferred onto the elevator table 412. The elevator table 412 is then descended by the elevator 430 to the wafer transfer portion 415 of the airtight space 416 (S 2). A nitrogen gas is supplied from the nozzle 438 to purge the airtight container 413 (S 3). While the cassette C is being descended, the position of a wafer is detected by using the first and second sensors 436a, 436b, 437a and 437b. The detection data is input to the process computer and processed therein. This is called "mapping operation" by which the wafer information, such as a wafer pitch and the presence or absence of the wafer in the cassette C are obtained (S 4). The mapping operation is performed to determine whether or not the wafer Wh protrudes from the cassette C by CPU (S 5).

The second sensors 437a and 437b detect the protruding wafer Wh. When the second sensors determine that it is difficult to push back the protruding wafer by use of the pushing member 435, an alarm is turned on (S 6) and the movement is immediately stopped (S 7). When no protruding wafer Wh from the cassette C is detected, cassette C is ascended (S 8).

During the ascending step (S 8), if the first sensors 436a and 436b detect the protruding wafer Wh (S 9), the ascending of the cassette C is stopped and the pushing member 435 is moved toward the cassette C and pushes the protruding wafer Wh into the cassette C (S 10). During the ascending step (S 8), all protruding wafers Wh are pushed into the cassette C by the pushing member 435 by checking the wafers W one by one. In this manner, the wafer is successfully prevented from hitting against the upper-wall of the air-tight space 416 while the cassette C is being ascended through the airtight container 413. Therefore, the breakage of the wafer W is successfully prevented.

When the cassette C is present in the wafer transfer portion 415, the wafer W is received by the cassette station arm 411 and transferred to the main arm 403a of the transfer mechanism 403 (S 11).

The wafer W on the main arm 403a is then subjected to a series of washing processes according to a predetermined recipe. First, the surface of the wafer W is washed with a brush in the surface washing unit 421 (S 12). Subsequently, the wafer W is turned over by the reverse-turn unit 427 or 428. The rear surface of the wafer W is washed with a brush in the rear surface washing unit 423. Thereafter, the wafer is turned over by means of the reverse-turn unit 427 or 428. If necessary, the washed wafer W is dried with heat in the heating unit 425 (S 13), and cooled in the cooling unit 426 (S 14).

After a series of processing are completed, the wafer W is transferred from the main arm 403a to the cassette station arm 411 and housed in the cassette C present in the wafer transfer portion 415 by the arm 411 (S 15). The same processing is performed with respect to a predetermined number of wafers W. When the predetermined number of wafers W are processed and housed in the cassette C, the cassette C is ascended (S 16) and returned to the airtight container 413 on the mounting portion 414. The cassette C is locked in the airtight container 413. The airtight container 413 containing the cassette C is transferred outside of the system (S 17).

The present invention is not limited to the above-mentioned embodiments. Modification of the present invention may be made in various ways. In the above-mentioned embodiments, we explained the example in which the present invention is applied to the washing unit. The present invention may be used in a unit in which other processing other than the washing is made, for example, a resist-coating and developing unit. The present invention may be effective not only when processing carried out in an airtight system but also when a substrate may hit against something or may be caught by something during the movement of a cassette. The present invention may be applied to various transfer units other than the process units. The substrate to be used in the present invention is not limited to the semiconductor wafer. Examples of the substrate include an LCD substrate, glass substrate, CD substrate, photomask, printing substrate and the like.

As explained in the foregoing, the present invention makes it possible to prevent the breakage of the substrate when the cassette is returned to the substrate transfer portion to the mounting portion, thereby attaining an extremely high yield of the wafers since a protruding substrate is checked by the detection means while the cassette is being moved from the transfer portion to the mounting portion, and the detected protruding substrate is pushed back by the pushing means.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A substrate treatment system comprising a process portion for processing a substrate under airtight conditions and a transfer portion for transferring a substrate to the process portion under the airtight conditions, wherein said transfer portion comprises a mounting portion for mounting an airtight container containing a cassette in which a plurality of substrates are horizontally placed, a substrate transfer portion provided in an airtight space communicating with the process portion below the mounting portion, moving means for moving the cassette between the mounting portion and the substrate transfer portion, detecting means for detecting a protruding substrate when the cassette moves from the substrate transfer portion to the mounting portion, pushing means for pushing the protruding substrate into the cassette when the protruding substrate is detected by the detection means, and a nozzle for supplying a non-oxidative gas into the airtight container mounted on said mounting portion, wherein the nozzle supplies the non-oxidative gas into the airtight container when the cassette is not present in said airtight container.

2. A substrate treatment system comprising a process portion for processing a substrate under airtight conditions and a transfer portion for transferring the substrate to the process portion under airtight conditions, and vise versa, wherein said transfer portion comprises a mounting portion for mounting an airtight container containing the cassette in which a plurality of substrates are placed horizontally, a substrate transfer portion provided in an airtight space below the mounting portion, for transferring a substrate to the process portion provided in airtight conditions communicating with said airtight space, moving means for moving the cassette between said mounting portion and said substrate transfer portion, detection means for detecting a protruding substrate when the cassette moves from said substrate transfer portion to said mounting portion, pushing means for pushing the protruding substrate detected by said detection means into the cassette, and a nozzle for supplying a non-oxidative gas into said airtight container mounted on said mounting portion, wherein the nozzle supplies the non-oxidative gas into said airtight container when the cassette is not present in said airtight container.

3. The system according to claim 2, wherein said detection means detects the protruding substrate while the cassette is being ascended and stops the ascending at the time the protruding substrate is detected.

4. The system according to claim 2, wherein said detection means has a light emitting portion and a light receiving portion.

5. A system according to claim 2, further comprising second detection means for detecting the substrate which protrudes from said cassette in a predetermined degree or more when the cassette is present in the substrate transfer portion.

6. A method for transferring a substrate under airtight conditions, comprising the steps of:

mounting an airtight container on a mounting portion, said airtight container containing a cassette in which a plurality of substrates are horizontally placed, moving the cassette to a substrate transferring portion positioned in an airtight space below the mounting portion;

cleaning the interior of the airtight container by spraying a non-oxidative gas into the airtight container, transferring the substrate in the cassette to said process portion at the substrate transfer portion, the process portion being provided in an airtight space communicating with said airtight space, receiving the substrate into the cassette positioned at the substrate transfer portion from the process portion, moving the cassette containing the received substrate to said mounting portion, detecting a protruding substrate when said cassette is moved to said mounting portion, and pushing the protruding substrate detected into the cassette.

* * * * *